(12) United States Patent
Lin et al.

(10) Patent No.: US 11,784,130 B2
(45) Date of Patent: Oct. 10, 2023

(54) STRUCTURE AND FORMATION METHOD OF PACKAGE WITH UNDERFILL

(71) Applicant: Taiwan Semiconductor Manufacturing Company, Ltd., Hsinchu (TW)

(72) Inventors: Yu-Sheng Lin, Zhubei (TW); Shin-Puu Jeng, Hsinchu (TW); Po-Yao Lin, Zhudong Township, Hsinchu County (TW); Chin-Hua Wang, New Taipei (TW); Shu-Shen Yeh, Taoyuan (TW); Che-Chia Yang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 85 days.

(21) Appl. No.: 17/459,215

(22) Filed: Aug. 27, 2021

(65) Prior Publication Data
US 2023/0064957 A1    Mar. 2, 2023

(51) Int. Cl.
*H01L 23/538*   (2006.01)
*H01L 21/48*    (2006.01)
(Continued)

(52) U.S. Cl.
CPC ...... *H01L 23/5385* (2013.01); *H01L 21/4853* (2013.01); *H01L 21/4857* (2013.01);
(Continued)

(58) Field of Classification Search
CPC ............. H01L 23/5385; H01L 21/4853; H01L 21/4857; H01L 21/6835; H01L 23/13;
(Continued)

(56) References Cited

U.S. PATENT DOCUMENTS

| | | | | |
|---|---|---|---|---|
| 5,607,883 A | * | 3/1997 | Bhattacharyya | .... H01L 23/3675 |
| | | | | 29/840 |
| 6,861,363 B2 | * | 3/2005 | Harchanko | ......... B81C 1/00626 |
| | | | | 438/725 |

(Continued)

FOREIGN PATENT DOCUMENTS

TW    201336121 A    9/2013

OTHER PUBLICATIONS

Chinese language office action dated Jan. 30, 2023, issued in application No. TW 111103063.

*Primary Examiner* — Vu A Vu
(74) *Attorney, Agent, or Firm* — McClure, Qualey & Rodack, LLP

(57) ABSTRACT

A package structure and a formation method of a package structure are provided. The method includes forming a recess in a circuit substrate, and the recess has a first sidewall and a second sidewall. The second sidewall is between the first sidewall and a bottommost surface of the circuit substrate, and the second sidewall is steeper than the first sidewall. The method also includes forming a die package, and the die package has a semiconductor die. The method further includes bonding the die package to the circuit substrate through bonding structures such that a portion of the semiconductor die enters the recess of the circuit substrate. In addition, the method includes forming an underfill material to surround the bonding structures and to fill the recess.

20 Claims, 35 Drawing Sheets

(51) Int. Cl.
*H01L 21/683* (2006.01)
*H01L 23/13* (2006.01)

(52) U.S. Cl.
CPC .......... *H01L 21/6835* (2013.01); *H01L 23/13* (2013.01); *H01L 23/5383* (2013.01); *H01L 23/5386* (2013.01); *H01L 2221/68372* (2013.01)

(58) Field of Classification Search
CPC ............. H01L 23/5383; H01L 23/5386; H01L 2221/68372
USPC ......................................................... 257/668
See application file for complete search history.

(56) References Cited

U.S. PATENT DOCUMENTS

| | | | |
|---|---|---|---|
| 7,893,527 B2* | 2/2011 | Shin | H01L 23/13 |
| | | | 257/703 |
| 8,536,695 B2* | 9/2013 | Liu | A61P 37/08 |
| | | | 174/262 |
| 8,922,000 B2* | 12/2014 | Han | H01L 23/42 |
| | | | 257/713 |
| 8,952,501 B2* | 2/2015 | Huang | H01L 23/49805 |
| | | | 257/623 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,082,743 B2* | 7/2015 | Hung | H01L 24/73 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,331,006 B2* | 5/2016 | Nakao | H01L 23/49579 |
| 9,337,116 B2* | 5/2016 | Pagaila | H01L 23/13 |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,559,028 B2* | 1/2017 | Takeda | H01L 23/3121 |
| 9,595,640 B2 | 3/2017 | Bae et al. | |
| 9,666,502 B2 | 5/2017 | Chen et al. | |
| 9,704,840 B2* | 7/2017 | Nishimura | H01L 33/56 |
| 9,735,131 B2 | 8/2017 | Su et al. | |
| 2014/0175067 A1* | 6/2014 | Reichenbach | B23K 26/361 |
| | | | 219/121.61 |
| 2018/0211926 A1* | 7/2018 | Jang | H01L 23/552 |

* cited by examiner

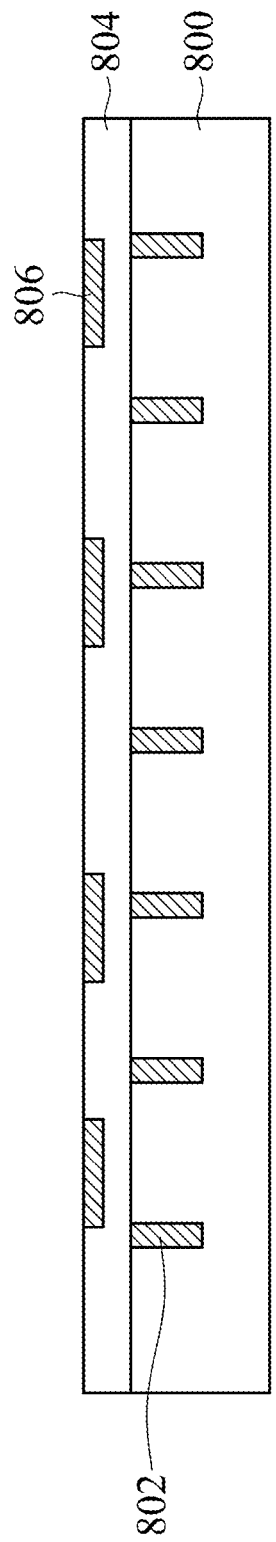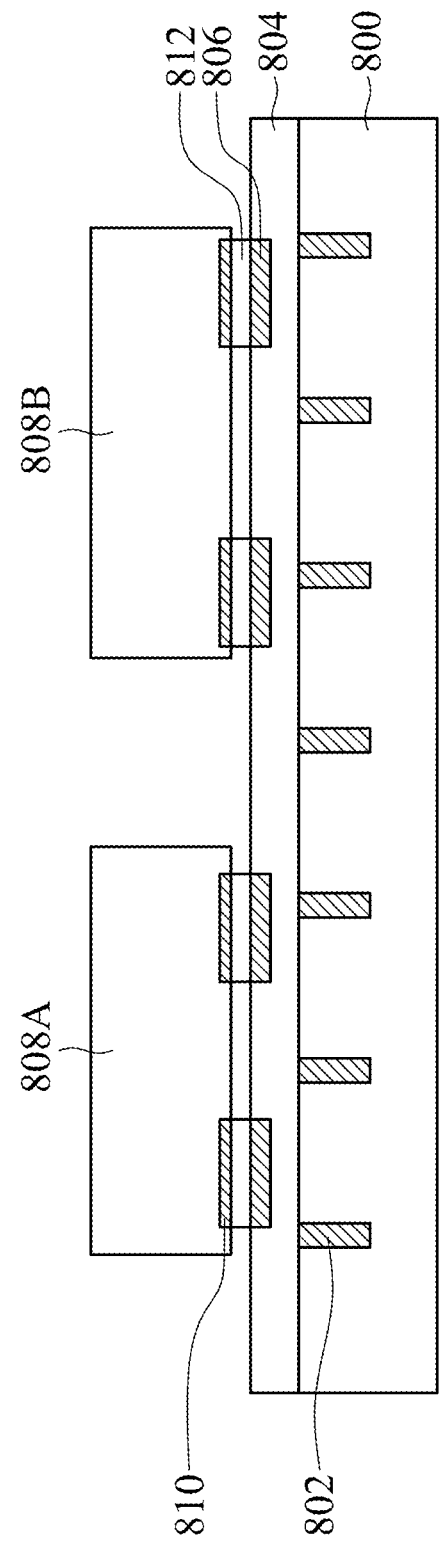
FIG. 8A
FIG. 8B

STRUCTURE AND FORMATION METHOD OF PACKAGE WITH UNDERFILL

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 8A-8K are cross-sectional views of various stages of a process for forming a portion of a package structure, in accordance with some embodiments.

DETAILED DESCRIPTION

Figure 1A:
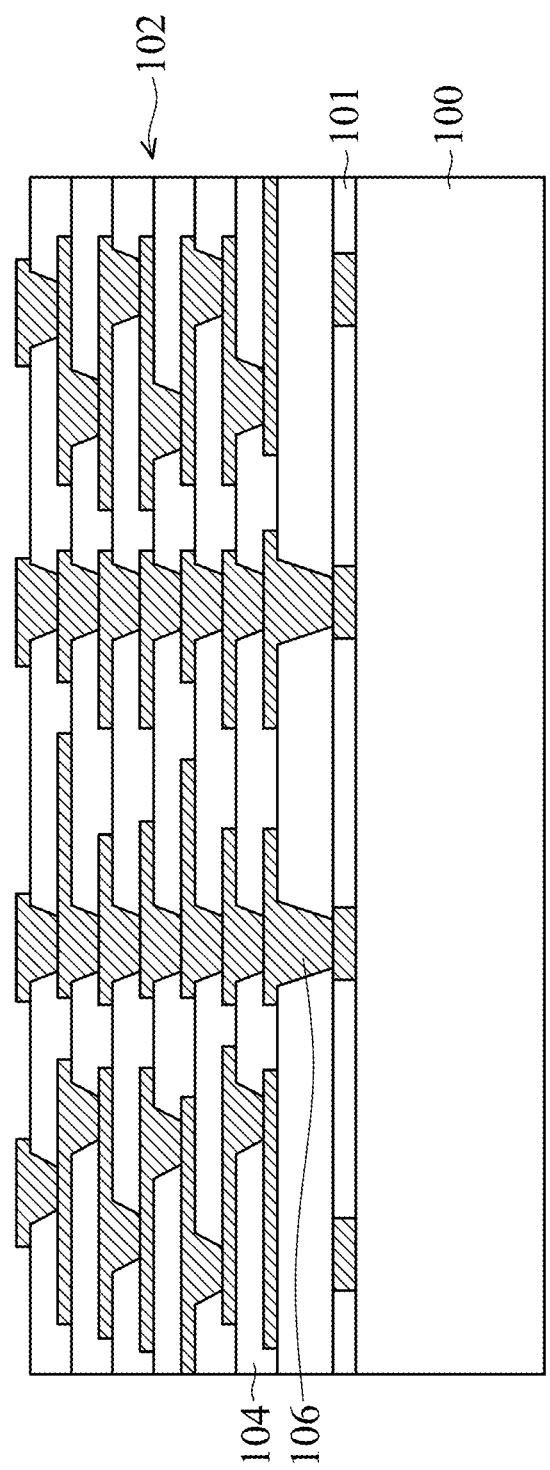
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 1A, a redistribution structure 102 is formed over the carrier substrate 100, in accordance with some embodiments. The redistribution structure 102 may include a release film 101, multiple insulating layers 104, and multiple conductive features 106. The release film 101 and the carrier substrate 100 may together be removed later.

In some embodiments, the insulating layers 104 are polymer-containing layers. The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104. These openings may be used to contain some of the conductive features 106.

The conductive features 106 may include conductive lines, conductive vias, and/or conductive pads. The conductive features 106 may be made of or include copper, cobalt, tin, titanium, gold, platinum, aluminum, tungsten, one or more other suitable materials, or a combination thereof. The conductive features 106 may be formed using an electroplating process, an electroless plating process, one or more other applicable processes, or a combination thereof. The formation of the conductive features 106 may further involve one or more etching processes.

As shown in FIG. 1A, some of the conductive features 106 in the redistribution structure 102 are conductive vias. In some embodiments, the upper portion of the conductive via is wider than the lower portion of the conductive via, as shown in FIG. 1A.

Figure 1B:
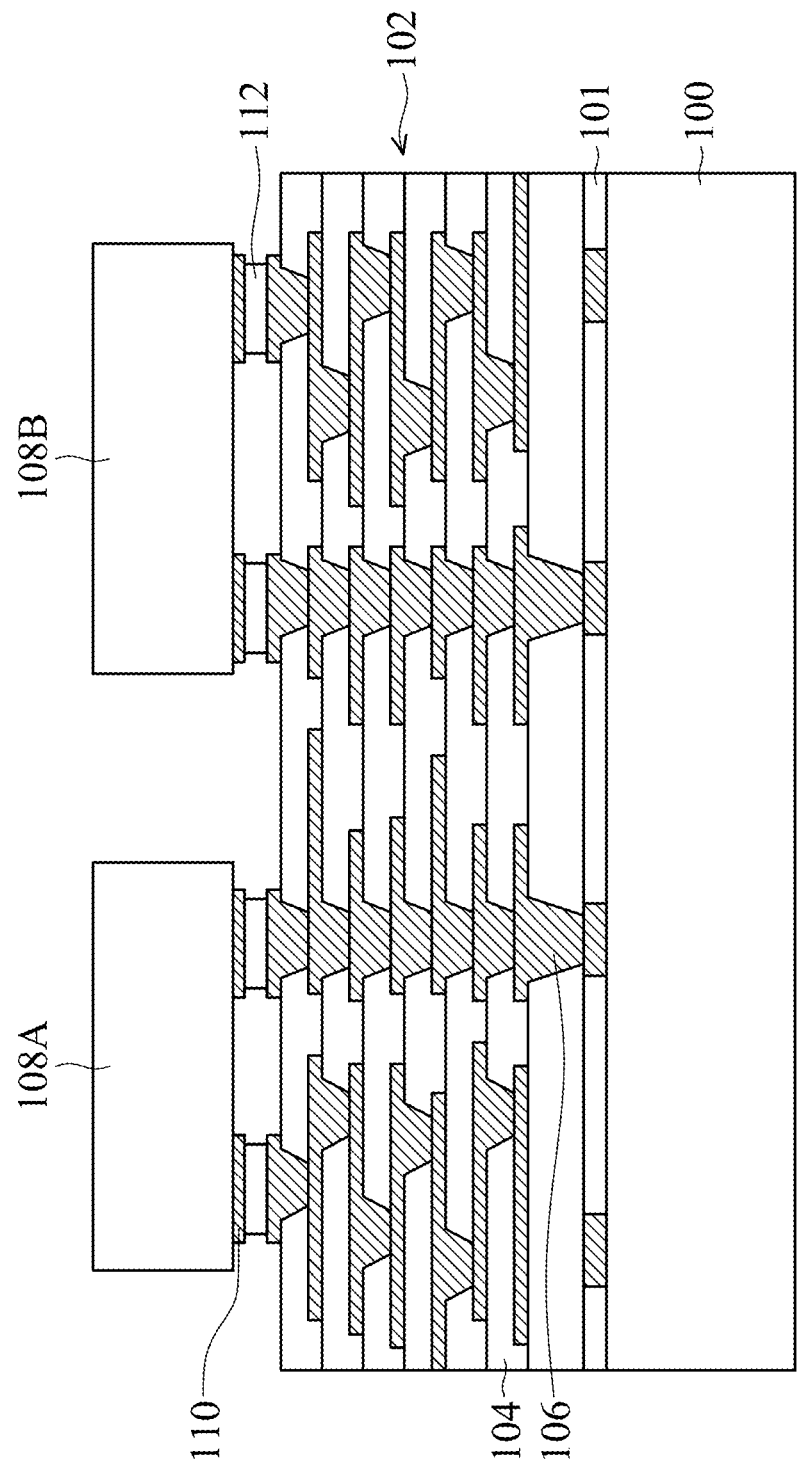

As shown in FIG. 1B, multiple chip structures (or chip-containing structures) 108A and 108B are disposed over the redistribution structure 102, in accordance with some embodiments. In some embodiments, before the chip structures 108A and 108B are disposed, a testing operation is performed to the redistribution structure 102 to ensure the quality and reliability of the redistribution structure 102.

In some embodiments, the chip structures 108A and 108B are bonded onto the conductive pads of the redistribution structure 102 through conductive connectors 112. In some embodiments, each of the chip structures 108A and 108B includes conductive pillars (or conductive pads) 110 with solder elements formed thereon. Solder elements may also be formed on the conductive pads of the redistribution structure 102. The chip structures 108A and 108B are picked and placed onto the redistribution structure 102. In some embodiments, the solder elements of the chip structures 108A and 108B and/or the solder elements on the conductive pads of the redistribution structure 102 are reflowed together. As a result, the reflowed solder elements form the conductive connectors 112.

Each of the chip structures 108A and 108B may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the redistribution structure 102. In some embodiments, some of the semiconductor dies include memory devices such as high bandwidth memory (HBM) devices. In some embodiments, the chip structures 108A and 108B are semiconductor dies such as SoC dies. In some embodiments, each of the chip structures 108A and 108B is system-on-integrated-chips (SoIC) that includes multiple semiconductor dies that are stacked together. In some other embodiments, the chip structures 108A and 108B are packages that include one or more semiconductor dies therein.

Figure 1C:
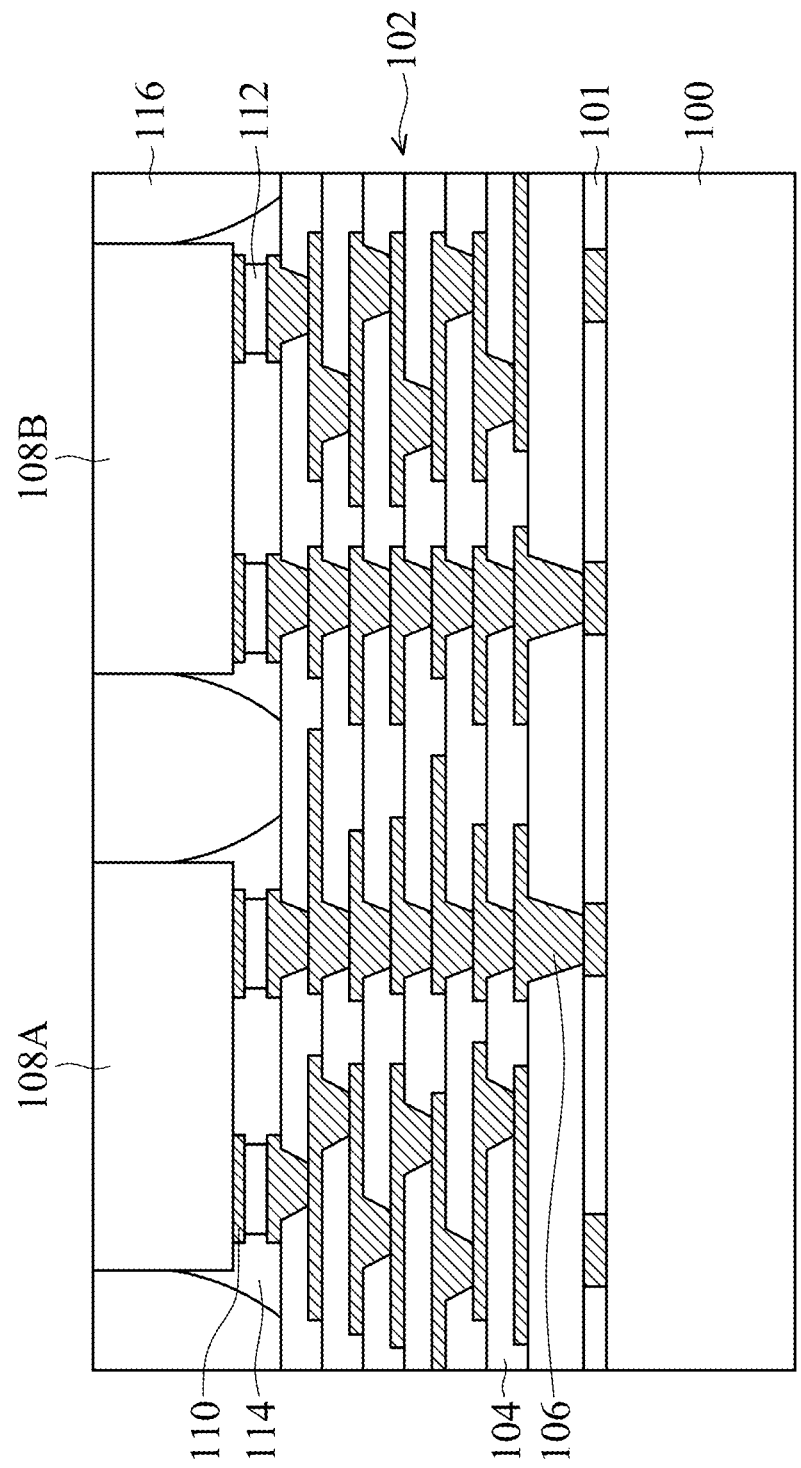

As shown in FIG. 1C, an underfill material 114 is formed to surround and protect the conductive connectors 112, in accordance with some embodiments. The underfill material 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A and 108B, as shown in FIG. 1C in accordance with some embodiments. In some embodiments, the protective layer 116 is in physical contact with the redistribution structure 102. In some embodiments, the protective layer 116 is separated from the conductive connectors 112 below the chip structures 108A and 108B by the underfill material 114.

However, embodiments of the disclosure are not limited thereto. Many variations and/or modifications can be made to embodiments of the disclosure. In some other embodiments, the underfill material 114 is not formed. In these cases, the protective layer 116 may be in direct contact with the conductive connectors 112 below the chip structures 108A and 108B.

In some embodiments, the protective layer 116 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill material 114. In some embodiments, the weight percentage of the fillers in the protective layer 116 is greater than the weight percentage of the fillers in the underfill material 114. The profiles, sizes, and/or materials of the fillers in the protective layer 116 and the underfill material 114 may be different from each other.

In some embodiments, a molding material (such as a liquid molding material) is introduced or injected to cover the redistribution structure 102 and the chip structures 108A and 108B. In some embodiments, a thermal process is then used to cure the liquid molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the top surface of the protective layer 116 is substantially level with the surfaces of the chip structures 108A and 108B.

Figure 1D:
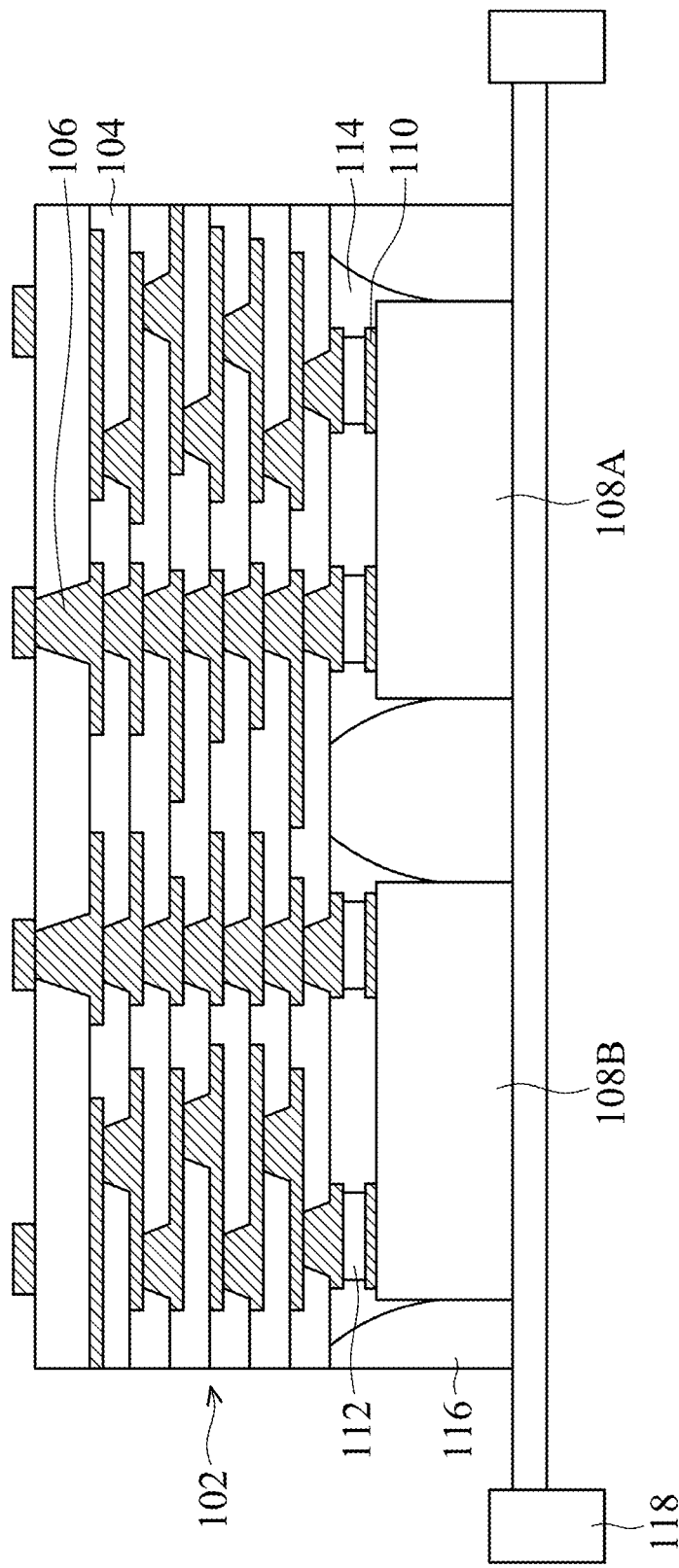

Afterwards, the structure shown in FIG. 1D is flipped upside down and attached onto a carrier tape 118, in accordance with some embodiments. Afterwards, the carrier substrate 100 and the release film 101 are removed, as shown in FIG. 1D in accordance with some embodiments. As a result, the surface of the redistribution structure 102 that is originally covered by the carrier substrate 100 is exposed.

Figure 1E:
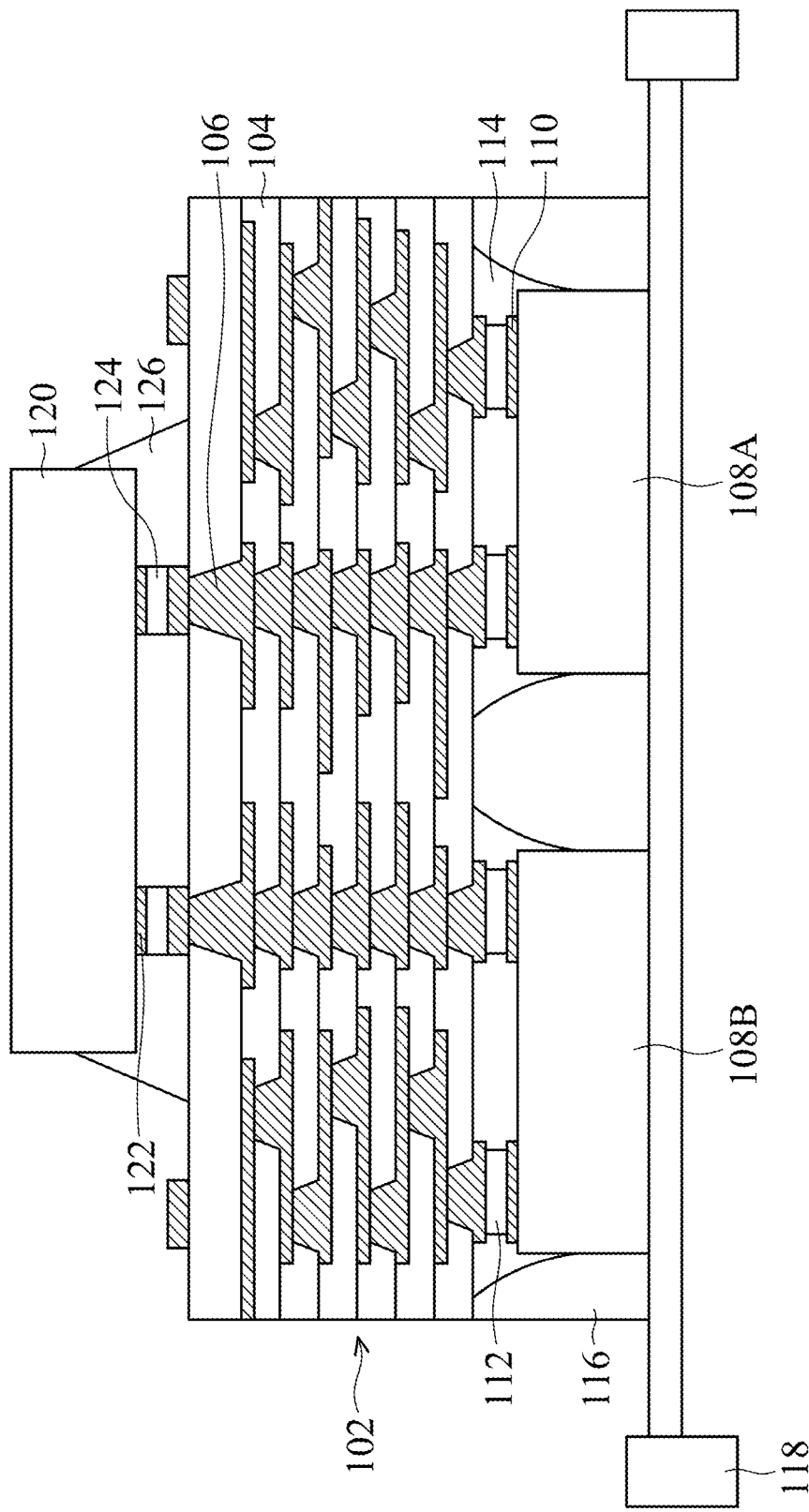

As shown in FIG. 1E, one or more chip structures (or chip-containing structures) 120 are bonded to the redistribution structure 102 through conductive connectors 124, in accordance with some embodiments. The material and formation method of the conductive connectors 124 may be the same as or similar to those of the conductive connectors 112. Through the conductive connectors 124, electrical connections are formed between the conductive pillars (or conductive pads) 122 of the chip structure 120 and some of the conductive features 106 of the redistribution structure 102. In some embodiments, the chip structure 120 forms electrical connections between the chip structures 108A and 108B through some of the conductive features 106 of the redistribution structure 102, as shown in FIG. 1E.

The chip structure 120 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 120 is an interconnection die that receive and/or transfer electrical signals to and/or from the chip structures 108A and 108B. In some embodiments, the chip structure 120 has no active devices formed therein. In some other embodiments, the chip structure 120 includes active devices and passive devices formed therein. In some other embodiments, a surface mounted device is used to replace the chip structure 120. The surface mounted device may include, for example, resistors, capacitors, insulators, one or more other suitable devices, or a combination thereof.

As shown in FIG. 1E, an underfill material 126 is formed over the redistribution structure 102 to surround the conductive connectors 124, in accordance with some embodiments. The material and formation method of the underfill material 126 may be the same as or similar to those of the underfill material 114. Many variations and/or modifications can be made to embodiments of the disclosure. In some other embodiments, the underfill material 126 is not formed.

Figure 1F:
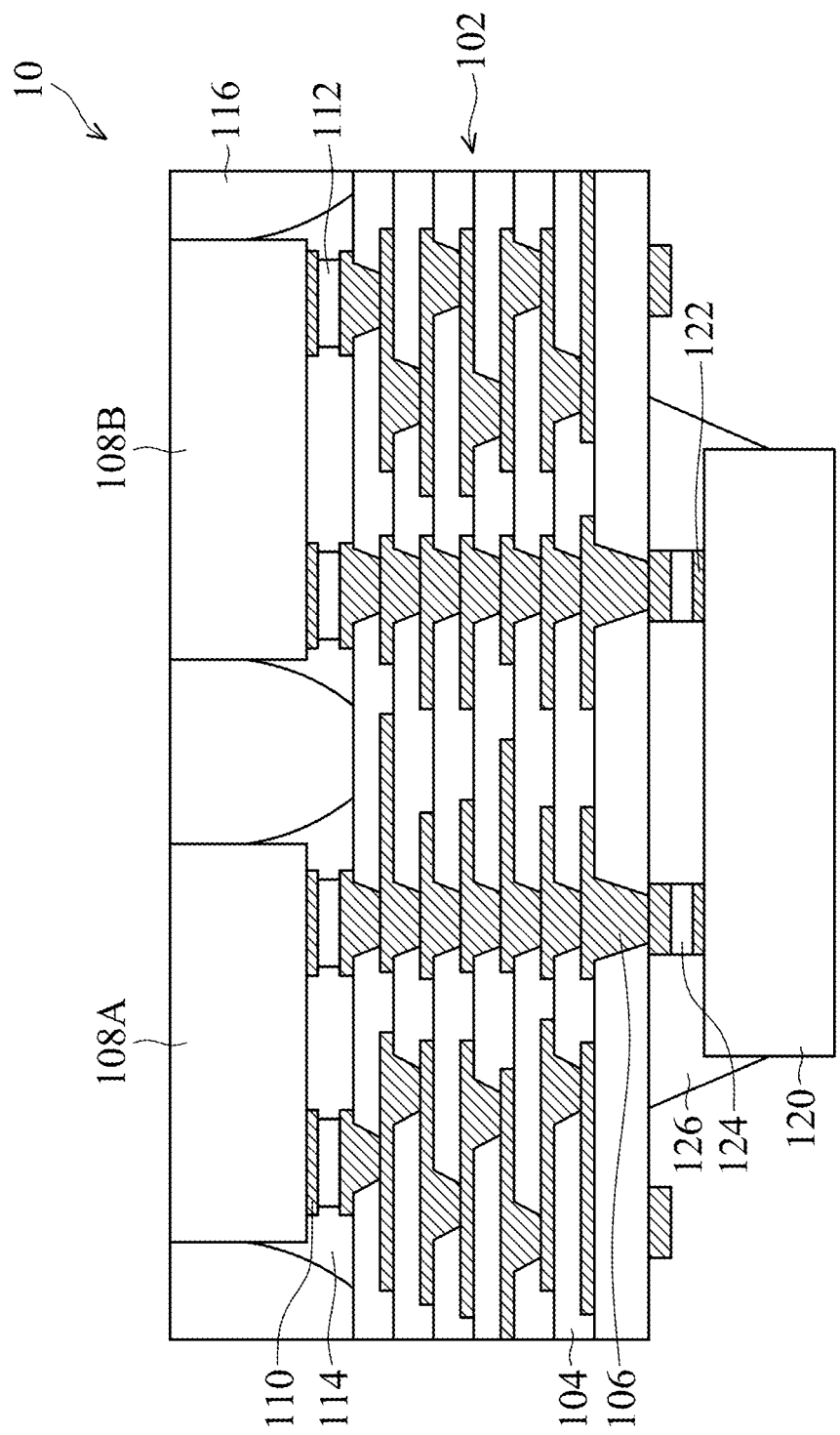

In some embodiments, a sawing process is used to cut through the structure shown in FIG. 1E into multiple separate die packages. After the sawing process, one die package 10 is picked from the carrier tape 118 and turned upside down, as shown in FIG. 1F in accordance with some embodiments. The die package 10 is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 1E into multiple smaller die packages. The entirety of the wafer-level package structure may directly be integrated into a large package structure without being sawed.

Many variations and/or modifications can be made to embodiments of the disclosure. FIGS. 3A, 3B, 3C, and 3D are plan views each showing a portion of a package structure, in accordance with some embodiments.

In some embodiments, FIGS. 3A, 3B, 3C, and 3D are plan views each showing a portion of the structure shown in FIG. 1E. As shown in FIGS. 3A, 3B, 3C, and 3D, the profiles and positions of the chip structures 108A, 108B, and 120 are illustrated. The chip structures 108A and 108B are physically separated from the chip structure 120 by the redistribution structure 102. Therefore, the chip structures 108A and 108B that are covered by the redistribution structure 102 are illustrated in dotted lines in FIGS. 3A, 3B, 3C, and 3D. The chip structure 120 may function as an interconnection die that receive and/or transfer electrical signals to and/or from the chip structures 108A and 108B.

Figure 3A:
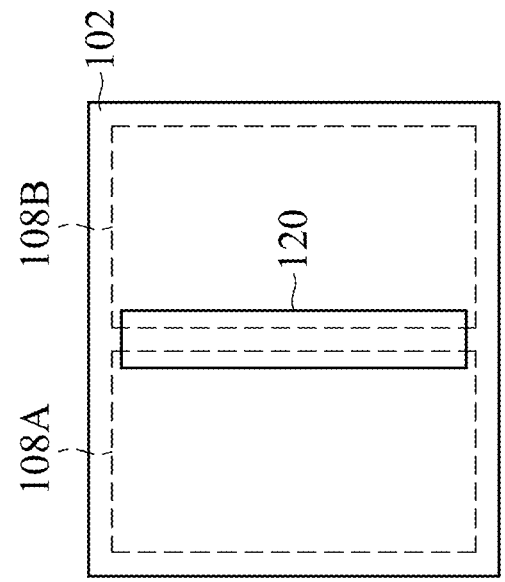
FIGS. 3A, 3B, 3C, and 3D are plan views each showing a portion of a package structure, in accordance with some embodiments.
Figure 3B:
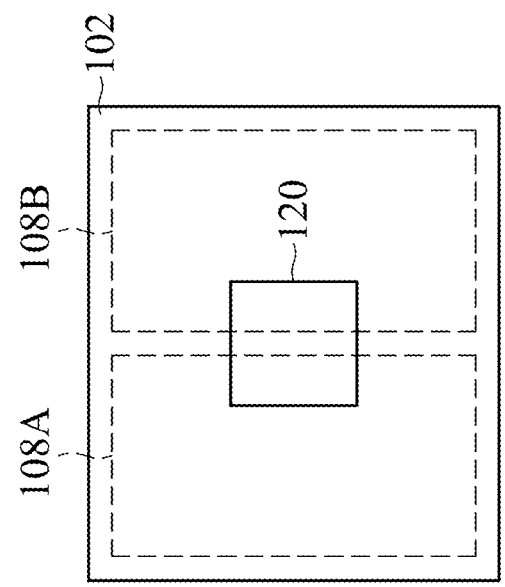

In some embodiments, the chip structure 120 extends across edges of the chip structures 108A and 108B. In some embodiments, the chip structure 120 has a square-like profile, as shown in FIG. 3A. In some other embodiments, the chip structure 120 has a rectangle-like profile, as shown in FIG. 3B. In some embodiments, the chip structure 120 is substantially as wide as the chip structure 108A or 108B.

Figure 3D:
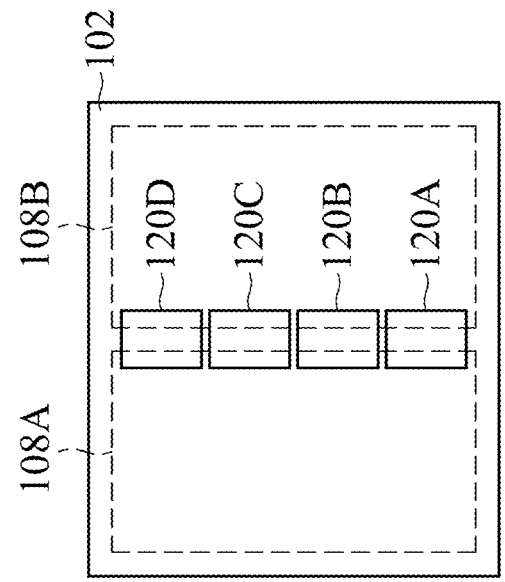
Figure 3C:
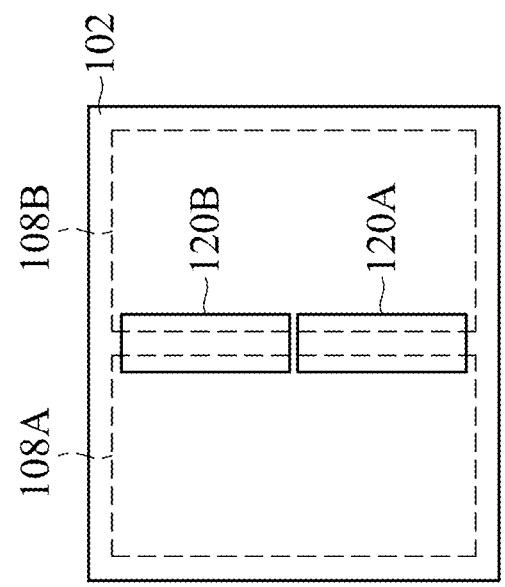

In some embodiments, more than one chip structure is bonded onto the redistribution structure 102. In some embodiments, there are two chip structures 120A and 120B are used to form electrical connections between the chip structures 108A and 108B, as shown in FIG. 3C. In some other embodiments, more than two chip structures are used to form electrical connections between the chip structures 108A and 108B. In some embodiments, there are four chip structures 120A-120D are used to form electrical connections between the chip structures 108A and 108B, as shown in FIG. 3D.

Figure 2A:
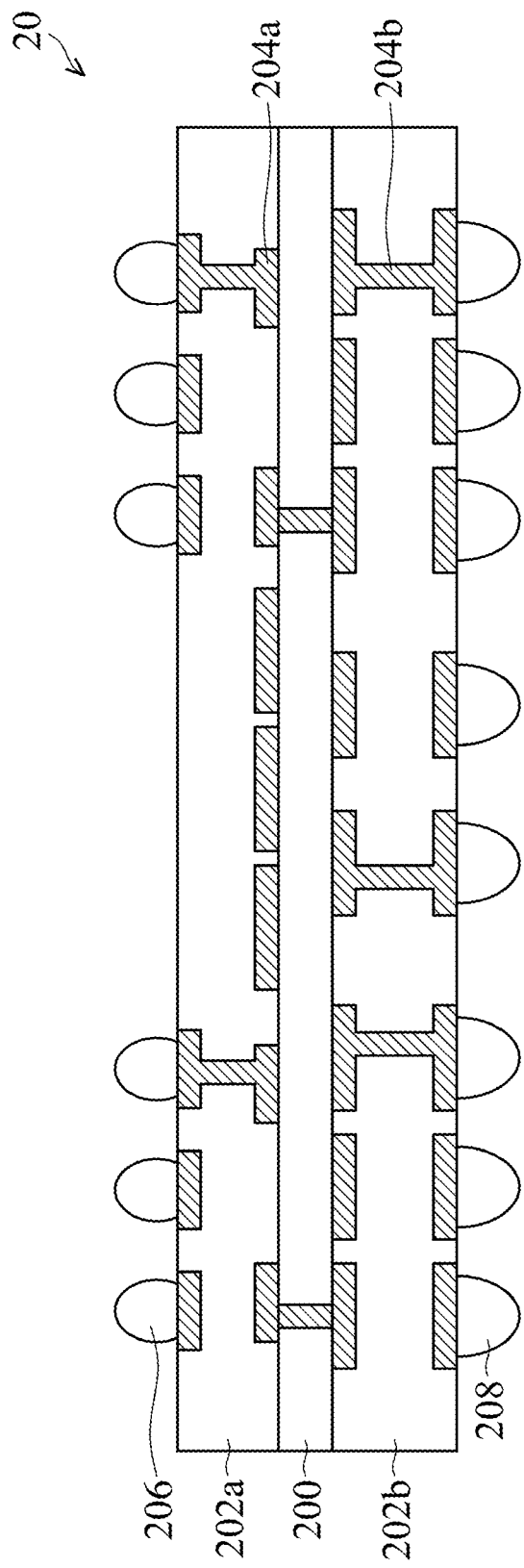
FIGS. 2A-2E are cross-sectional views of various stages of a process for forming a portion of a package structure, in accordance with some embodiments.

FIGS. 2A-2E are cross-sectional views of various stages of a process for forming a portion of a package structure, in accordance with some embodiments. As shown in FIG. 2A, a circuit substrate (or a package substrate) 20 is received or provided. In some embodiments, the circuit substrate 20 includes a core portion 200. The circuit substrate 20 may further includes multiple insulating layers 202a and 202b and multiple conductive features 204a and 204b. The conductive features 204a and 204b may be used to route electrical signals between opposite sides of the circuit substrate 20. The insulating layers 202a and 202b may be made of or include one or more polymer materials. The conductive features 204a and 204b may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion 200 to provide electrical connections between elements disposed on either side of the core portion 200. In some embodiments, the circuit substrate 20 further includes bonding structures 206 and 208. In some embodiments, the bonding structures 206 and 208 are solder bumps. In some embodiments, the bonding structures 208 are used for bonding with another element such as a printed circuit board.

In some embodiments, the circuit board 20 has a predetermined region where no conductive feature is formed. The predetermined region will be partially removed to form one or more recesses later.

Figure 2B:
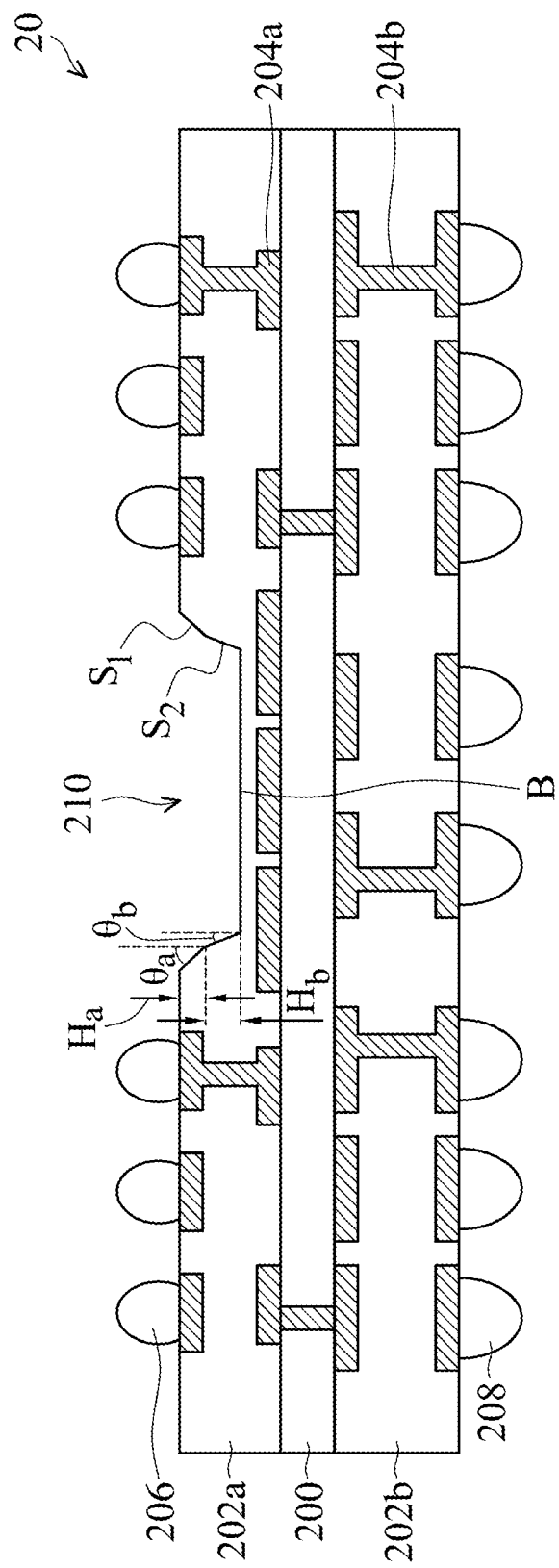

As shown in FIG. 2B, the predetermined region of the circuit substrate 20 is partially removed to form a recess 210, in accordance with some embodiments. After the partial removal of the circuit substrate 20, interior sidewalls of the circuit substrate 20 are formed. The interior sidewalls of the circuit substrate 20 define the sidewalls of the recess 210, as shown in FIG. 2B.

In some embodiments, the recess 210 is formed using an energy beam drilling process. The energy beam drilling process may include a laser beam drilling process, an ion beam drilling process, an electron beam drilling process, one or more other applicable processes, or a combination thereof. The energy beam drilling process may be performed multiple times to different regions of the circuit substrate 20. As a result, the recess 210 with the designed profile is formed. In some other embodiments, the recess 210 is formed using a mechanical drilling process. For example, a computer numerical control (CNC) engraving machine may be used to form the recess 210. In some other embodiments, one or more photolithography processes and one or more etching processes are used to partially remove the circuit substrate 20, so as to form the recess 210. In some other embodiments, the circuit substrate 20 is partially removed using an energy beam drilling process, a mechanical drilling process, an etching process, one or more other applicable processes, or a combination thereof.

In some embodiments, the recess 210 has a first sidewall $S_1$, a second sidewall $S_2$, and a bottom portion B, as shown in FIG. 2B. The first sidewall $S_1$ is an upper sidewall, and the second sidewall $S_2$ is a lower sidewall. The second sidewall $S_2$ is between the first sidewall $S_1$ and the bottommost surface of the circuit substrate 20, as shown in FIG. 2B. In some embodiments, the first sidewall $S_1$ and the second sidewall $S_2$ have different slopes. In some embodiments, the second sidewall $S_2$ is steeper than the first sidewall $S_1$, as shown in FIG. 2B. In some embodiments, the first sidewall $S_1$ and the second sidewall $S_2$ directly connect to each other. In some embodiments, the first sidewall $S_1$ and the second sidewall $S_2$ intersect each other.

As shown in FIG. 2B, the first sidewall $S_1$ is at an angle $\theta_a$ to the vertical, and the second sidewall $S_2$ is at an angle $\theta_b$ to the vertical. In some embodiments, the angle $\theta_a$ is greater than the angle $\theta_b$. The angle $\theta_a$ may be in a range from about 30 degrees to about 60 degrees. The angle $\theta_b$ may be in a range from about 15 degrees to about 30 degrees. The ratio ($\theta_a/\theta_b$) of the angle $\theta_a$ to the angle $\theta_b$ may be in a range from about 2 to about 4.

In some cases, if the angle $\theta_a$ is smaller than 30 degrees, a subsequent formation of an underfill material in the recess 210 may be negatively affected. One or more air voids might be formed or trapped in the underfill material. As a result, the underfill material might not be able to provide sufficient protection to a component that is to be disposed in the recess 210. In some other cases, if the angle $\theta_a$ is greater than 60 degrees, the recess 210 might occupy too large area of the circuit substrate 20. The available signal routing area of the circuit substrate 20 might thus be insufficient.

As shown in FIG. 2B, the first sidewall $S_1$ has a height Ha, and the second sidewall $S_2$ has a height Hb. In some embodiments, the heights Ha and Hb are substantially equal to each other. In some other embodiments, the heights Ha and Hb are different from each other. The ratio (Ha/Ha+Hb) of the height Ha to the total height Ha+Hb may be in a range from about 0.1 to about 0.9. In some cases, if the ratio Ha/Ha+Hb is smaller than about 0.1, it may be hard to introduce an underfill material into the recess 210 during a subsequent underfill formation process. In some cases, if the ratio Ha/Ha+Hb is greater than about 0.9, the recess 210 might occupy too large area of the circuit substrate 20. The available signal routing area of the circuit substrate 20 might thus be insufficient.

Figure 2C:
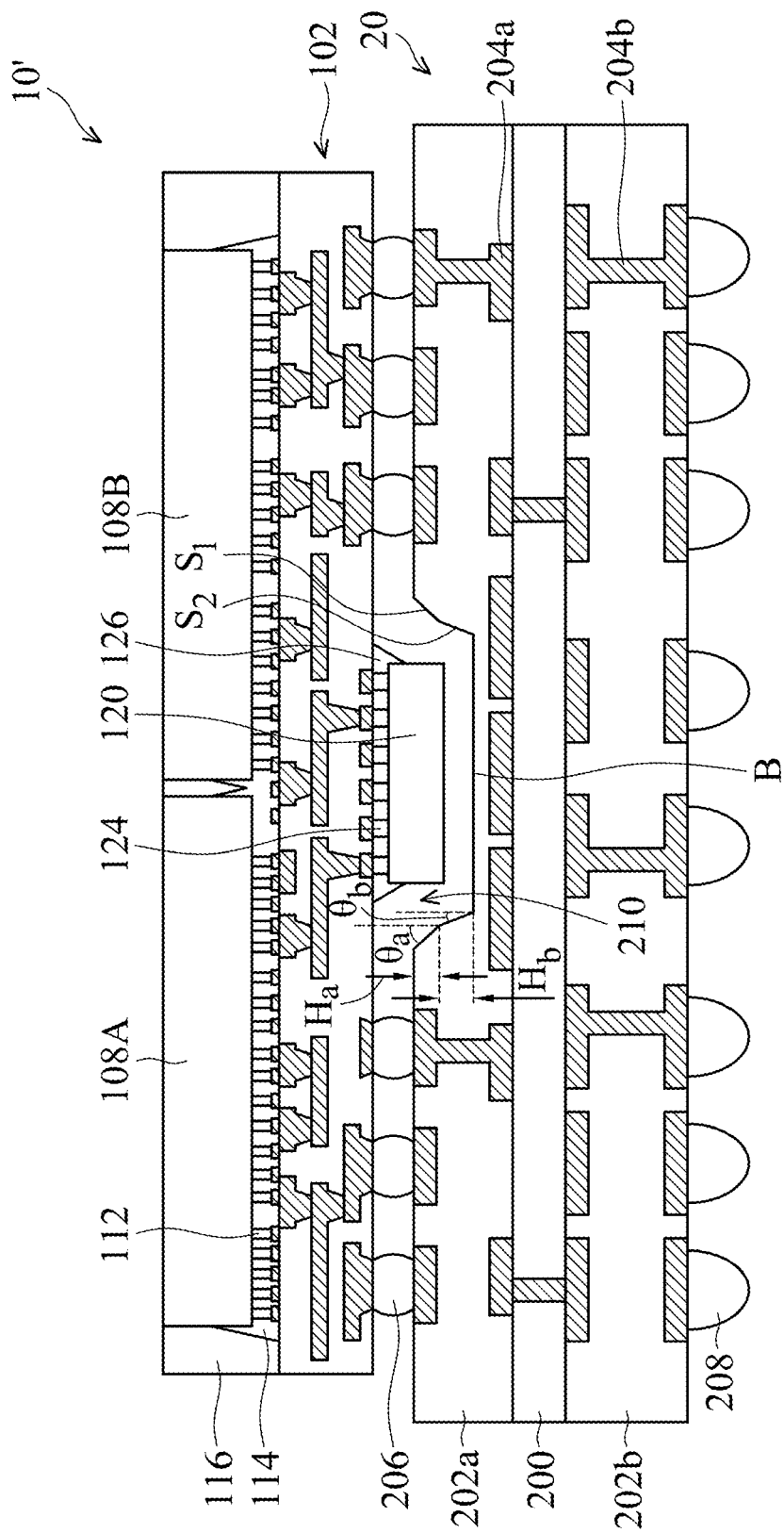

As shown in FIG. 2C, a die package 10' that is the same as or similar to the die package 10 shown in FIG. 1F is received or provided. In some embodiments, the die package 10' is picked and placed over the circuit substrate 20, in accordance with some embodiments. Afterwards, the die package 10' is bonded to the circuit substrate 20 through the bonding structures 206.

In some embodiments, the die package 10' is disposed over the circuit substrate 20 such that the conductive pads of the redistribution structure 102 are in physical contact with the bonding structures 206. In some other embodiments, additional solder elements may be formed on the conductive pads of the redistribution structure 102 before the die package 10' is disposed over the circuit substrate 20. Afterwards, a thermal reflow process and/or a thermal compression process are used to bond the die package 10' to the circuit substrate 20. As a result, a component (such as the chip structure 120) of the die package 10' enters the recess 210, as shown in FIG. 2C. The recess 210 provides a space for partially containing the component of the die package 10'. The total height of the package structure may thus be reduced further. In some other embodiments, the component of the die package entering the recess 210 is a surface mounted device that includes, for example, resistors, capacitors, insulators, one or more other suitable devices, or a combination thereof.

Figure 4A:
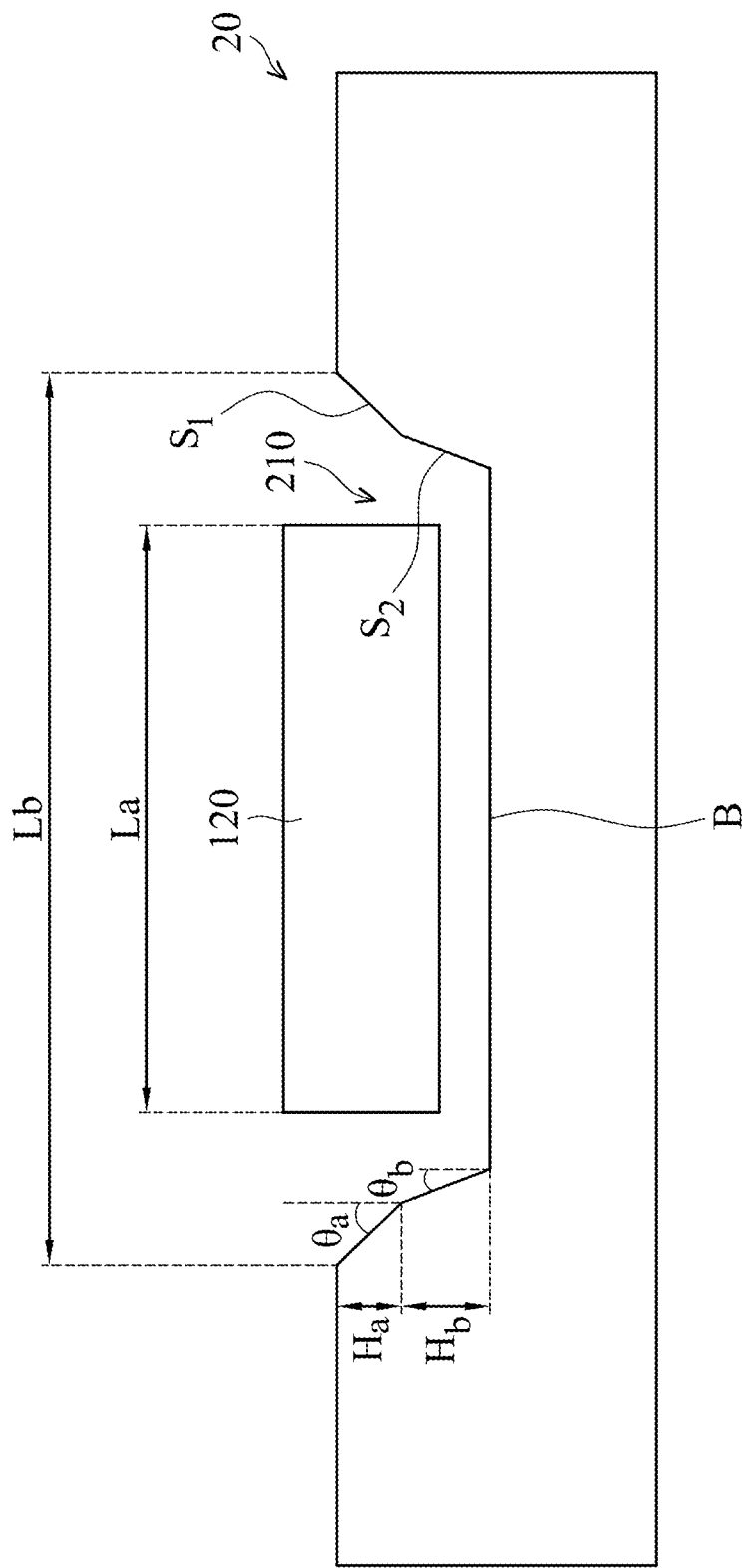
FIGS. 4A and 4B are cross-sectional views each showing a portion of a package structure, in accordance with some embodiments.
Figure 5B:
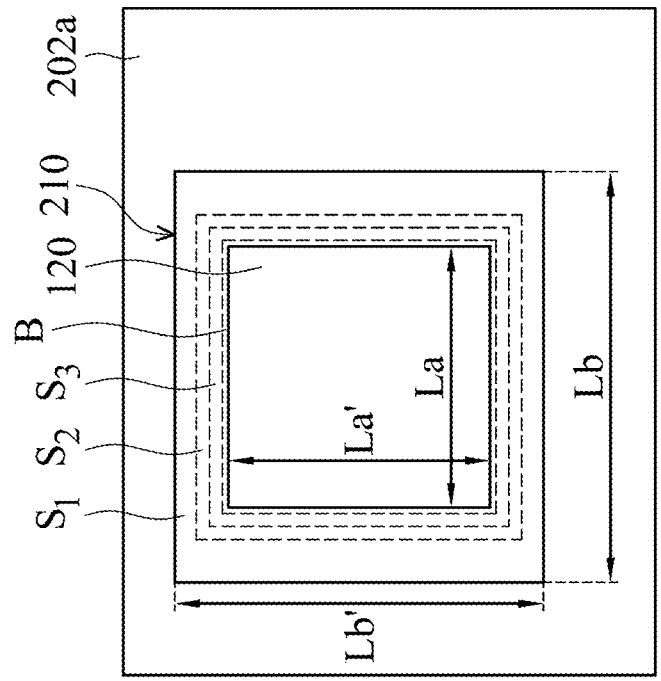
FIGS. 5A, 5B, 5C, 5D, and 5E are plan views each showing a portion of a package structure, in accordance with some embodiments.
Figure 5A:
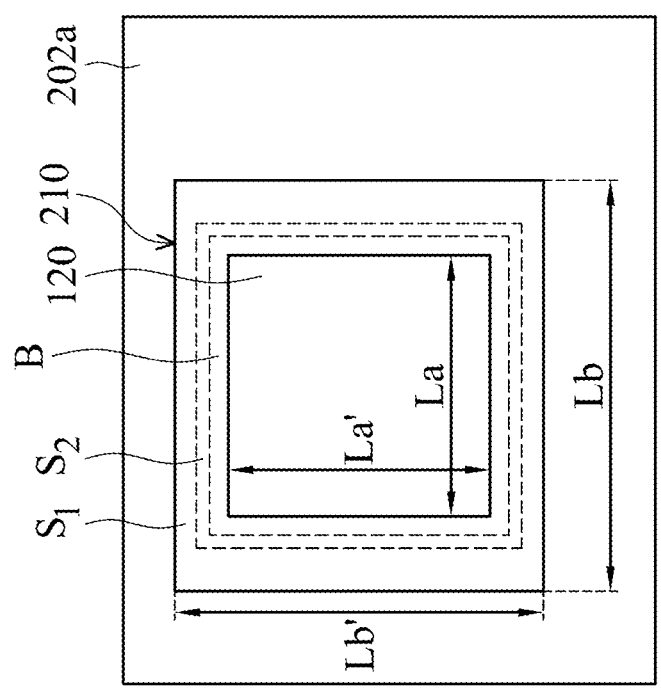

FIG. 4A is a cross-sectional view of a portion of a package structure, in accordance with some embodiments. In some embodiments, FIG. 4A is an enlarged cross-sectional view partially showing the chip structure 120, the circuit substrate 20, and the recess 210. FIG. 5A is a plan view showing a portion of a package structure, in accordance with some embodiments. In some embodiments, FIG. 5A shows a top view of the structure shown in FIG. 4A.

In some embodiments, there is one component (i.e., the chip structure 120) of the die package 10' entering the recess 210 after the bonding process between the die package 10' and the circuit substrate 20, as shown in FIG. 5A. As shown in FIGS. 4A and 5A, the recess 210 has the first sidewall $S_1$, the second sidewall $S_2$, and the bottom portion B. As shown in FIGS. 4A and 5A, the chip structure 120 has widths La and La', and the recess 210 has widths Lb and Lb'. The ratio (La/Lb) of the width La of the chip structure 120 to the width Lb of the recess 210 may be in a range from about 0.1 to about 0.75. The ratio (La'/Lb') of the width La' of the chip structure 120 to the width Lb' of the recess 210 may be in a range from about 0.1 to about 0.75. In some embodiments, the widths La and Lb are measured along a first direction and a second direction that are parallel to each other. The widths La' and Lb' are measured along a third direction and a fourth direction that are parallel to each other. In some embodiments, the first direction is substantially perpendicular to the third direction.

In some cases, if the ratio La/Lb or the ratio La'/Lb' is greater than about 0.75, a subsequent formation of an underfill material in the recess 210 may be negatively affected. One or more air voids might be formed in the underfill material. As a result, the underfill material might not be able to provide sufficient protection to the chip structure 120.

Figure 5C:
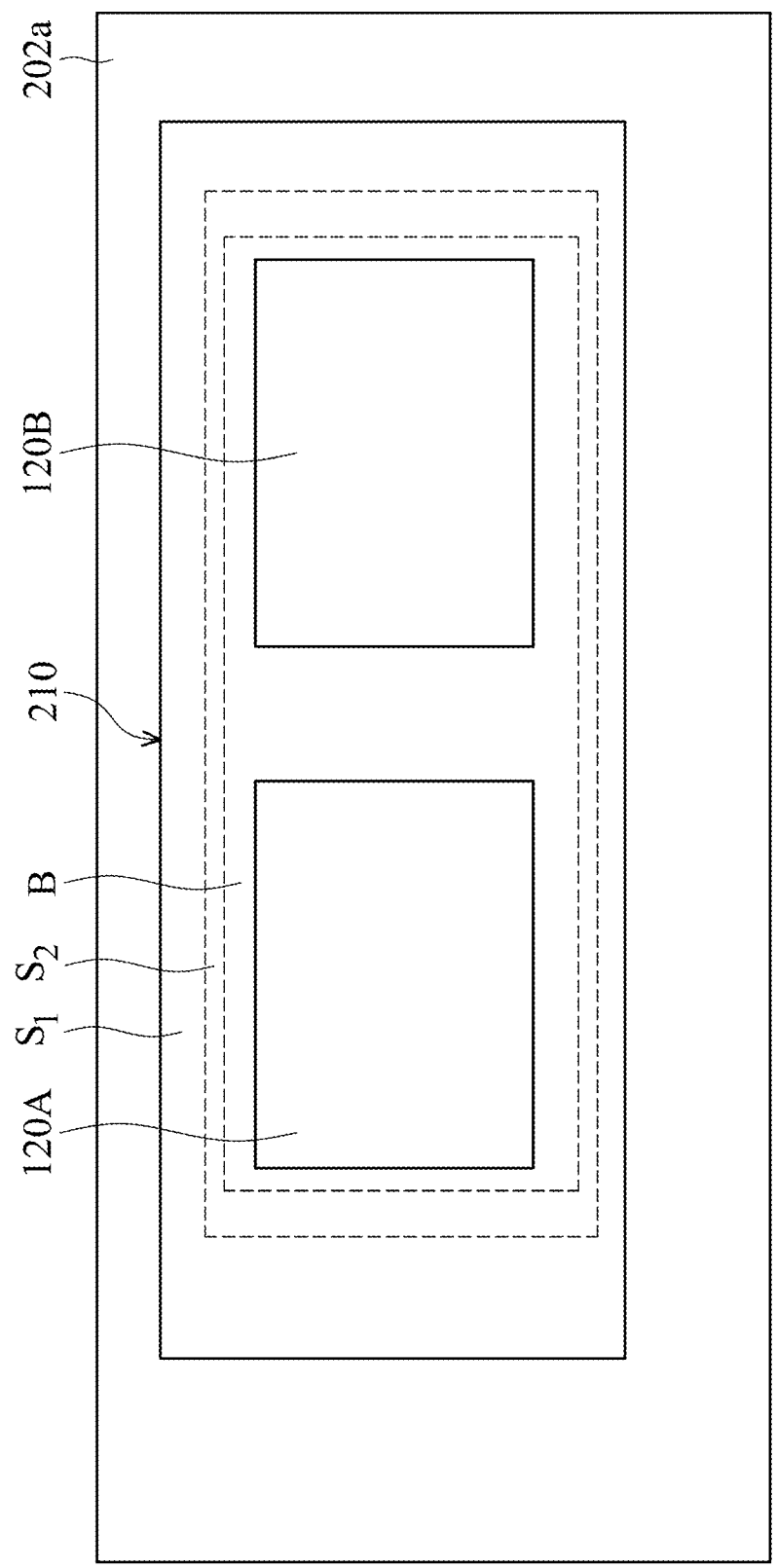

Many variations and/or modifications can be made to embodiments of the disclosure. FIG. 5C is a plan view showing a portion of a package structure, in accordance with some embodiments. In some embodiments, FIG. 5C shows a top view of the structure shown in FIG. 4A. In some embodiments, there are more than one component of the die package 10' entering the recess 210 after the bonding process between the die package 10' and the circuit substrate 20. Similar to the embodiments illustrated in FIG. 3C, the die package 10' may include two components to be partially disposed into the recess 210. In some embodiments, there are two components (such as chip structures 120A and 120B) of the die package 10' entering the recess 210 after the bonding process between the die package 10' and the circuit substrate 20, as shown in FIG. 5C.

Figure 5D:
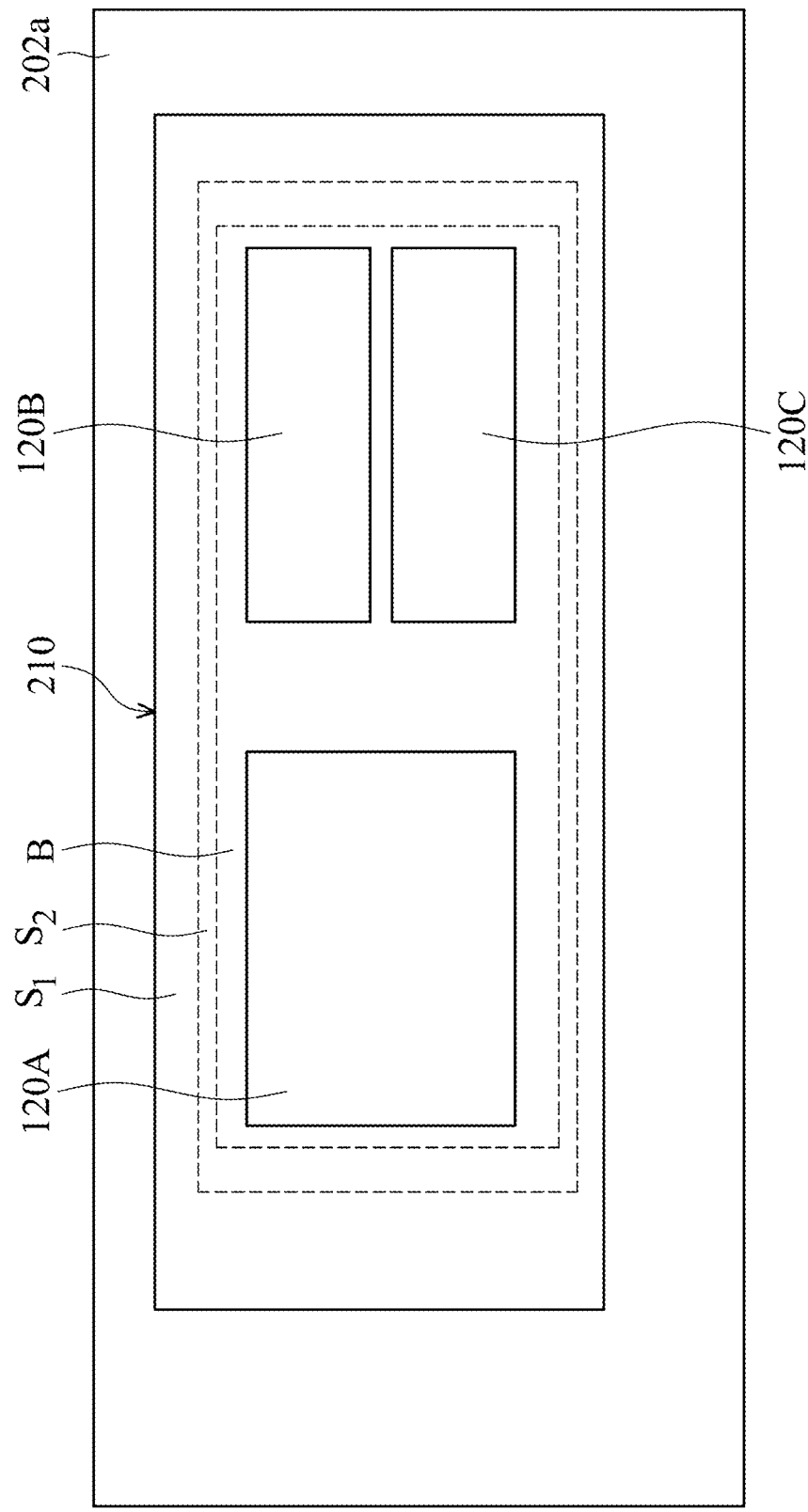

Many variations and/or modifications can be made to embodiments of the disclosure. FIG. 5D is a plan view showing a portion of a package structure, in accordance with some embodiments. In some embodiments, FIG. 5D shows a top view of the structure shown in FIG. 4A. In some embodiments, there are more than two components of the die package 10' entering the recess 210 after the bonding process between the die package 10' and the circuit substrate 20. Similar to the embodiments illustrated in FIG. 3D, the die package 10' may include more than two components to be partially disposed into the recess 210. In some embodiments, there are three components (such as chip structures 120A, 120B, and 120C) of the die package 10' entering the recess 210 after the bonding process between the die package 10' and the circuit substrate 20, as shown in FIG. 5D. In some embodiments, the profiles and/or sizes of some of the chip structures to be partially disposed into the recess 210 are different from each other.

Figure 5E:
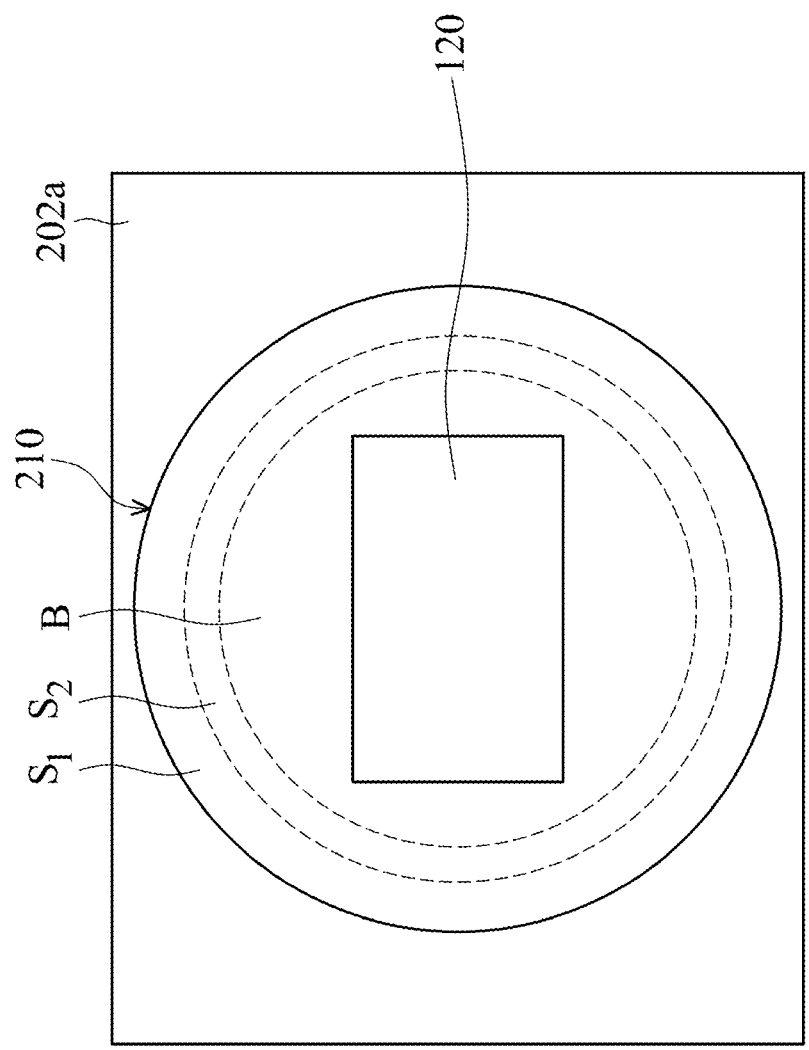

Many variations and/or modifications can be made to embodiments of the disclosure. FIG. 5E is a plan view showing a portion of a package structure, in accordance with some embodiments. In some embodiments, FIG. 5E shows a top view of the structure shown in FIG. 4A. In some embodiments, the recess 210 has a profile other than the rectangle profile or the rectangle-like profile. In some embodiments, the top view of the recess 210 has a circle profile or an oval-like profile. In some embodiments, there is only one component (such as the chip structure) of the die package 10' entering the recess 210 after the bonding process between the die package 10' and the circuit substrate 20. However, embodiments of the disclosure are not limited thereto. In some other embodiments, there two or more components of the die package 10 entering the recess 210 after the bonding process.

As mentioned above, in some embodiments, the recess 210 has two sidewalls that have different slopes. However, embodiments of the disclosure are not limited thereto. Many variations and/or modifications can be made to embodiments of the disclosure. In some other embodiments, the recess 210 has three or more sidewalls that have different slopes from each other. In some embodiments, a lower sidewall of these sidewalls is steeper than an upper sidewall of these sidewalls.

Figure 4B:
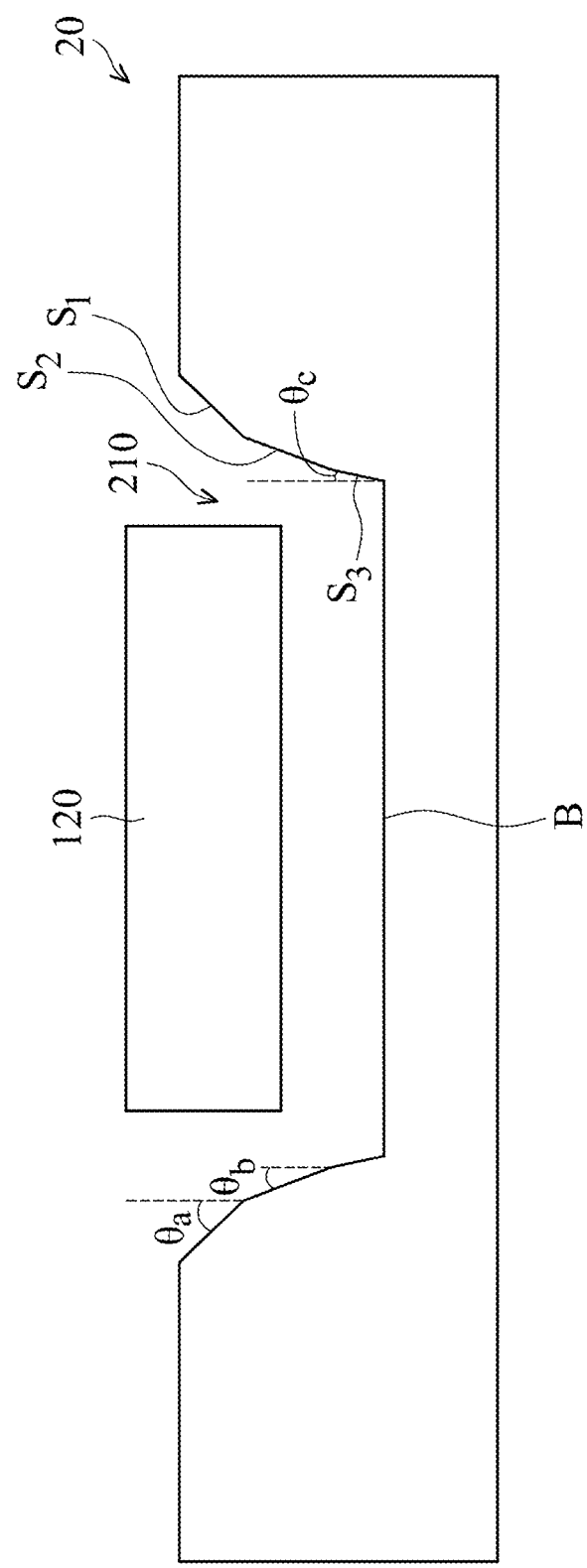

FIG. 4B is a cross-sectional view of a portion of a package structure, in accordance with some embodiments. In some embodiments, FIG. 4A is an enlarged cross-sectional view partially showing the chip structure 120, the circuit substrate 20, and the recess 210. FIG. 5B is a plan view showing a portion of a package structure, in accordance with some embodiments. In some embodiments, FIG. 5B shows a top view of the structure shown in FIG. 4B.

As shown in FIGS. 4B and 5B, the recess 210 has the first sidewall $S_1$, the second sidewall $S_2$, a third sidewall $S_3$, and the bottom portion B. The second sidewall $S_2$ is between the first sidewall $S_1$ and the third sidewall $S_3$. In some embodiments, the slopes of the first sidewall $S_1$, the second sidewall $S_2$, and the third sidewall $S_3$ are different from each other. In some embodiments, the third sidewall $S_3$ is steeper than the second sidewall $S_2$, and the second sidewall $S_2$ is steeper than the first sidewall $S_1$. In some embodiments, the second sidewall $S_2$ directly connects to the first sidewall $S_1$ and the third sidewall $S_3$. The second sidewall $S_2$ intersects the first sidewall $S_1$ and the third sidewall $S_3$.

As shown in FIG. 4B, the third sidewall $S_3$ is at an angle $\theta_c$ to the vertical. In some embodiments, the angle $\theta_b$ is greater than the angle $\theta_c$. The angle $\theta_c$ may be in a range from about 5 degrees to about 15 degrees. The recess 210 shown in FIG. 4B may be formed using an energy beam drilling process, a mechanical drilling process, an etching process, or a combination thereof.

Many variations and/or modifications can be made to embodiments of the disclosure. Similar to the embodiments illustrated in FIGS. 5C and 5D, two or more chip structures with the same or different profiles may be partially disposed into the recess 210 with three or more sidewalls having different slopes. Similar to the embodiments illustrated in FIG. 5E, the recess 210 with three or more sidewalls having different slopes may have a top view profile that is a circle profile or an oval-like profile.

Figure 2D:
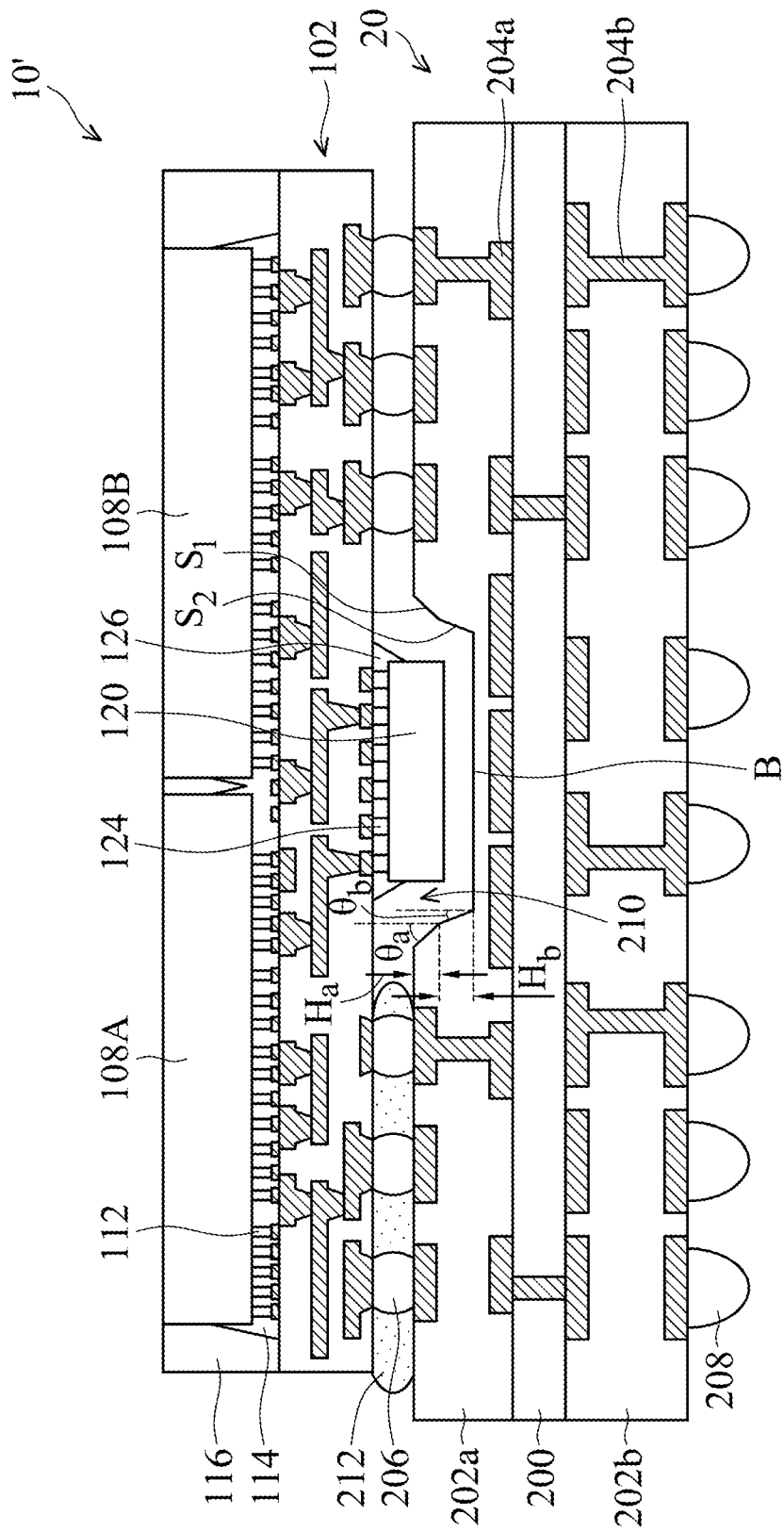

Referring to FIG. 2D, an underfill liquid 212 is dispensed onto the circuit substrate 20 along a side of the die package 10', in accordance with some embodiments. The underfill liquid 212 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill liquid 212 may be drawn into the space between the die package 10' and the circuit substrate 20 to surround some of the bonding structures 206 by the capillary force, as shown in FIG. 2D.

Figure 2E:
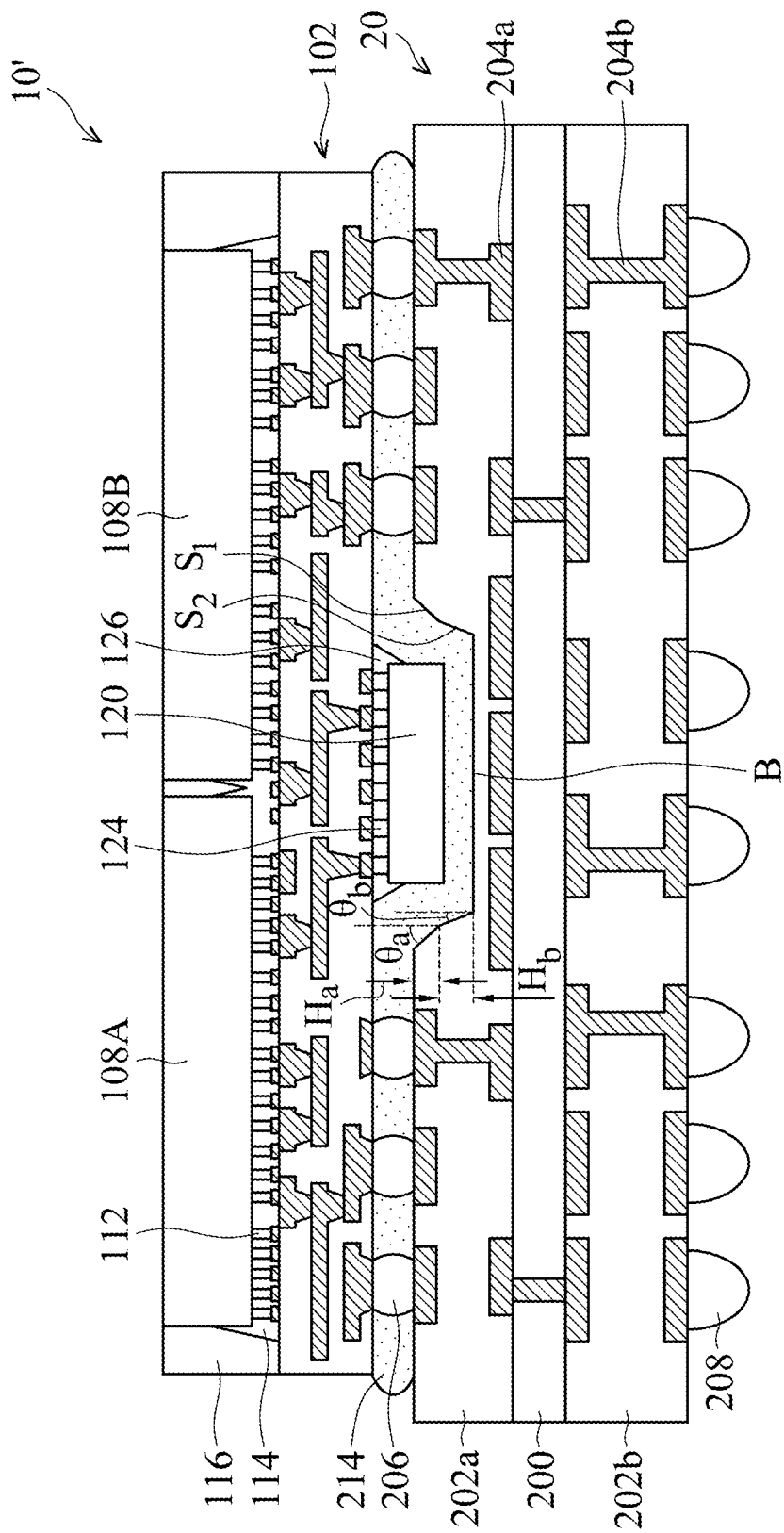

As shown in FIG. 2E, the underfill liquid 212 is further drawn into the recess 210 and reaching another side of the die package 10' by the capillary force, in accordance with some embodiments. As a result, an underfill material 214 that surrounds the bonding structures 206 and fills the recess 210 is formed. In some embodiments, the underfill material 214 is in direct contact with the interior sidewalls (such as the first sidewall $S_1$ and the second sidewall $S_2$) of the circuit substrate 20.

Due to the profile of the recess 210, the underfill liquid 212 used for forming the underfill material 214 is drawn into the recess 210 by a stronger capillary force. The underfill liquid 212 fills the recess 210 at a faster flow rate, so as to prevent or significant reduce voids to be trapped in the underfill material 214. Since the potential void risk is reduced, the underfill material 214 may provide sufficient protection to the bonding structures 206 and the component(s) of the die package 10' (such as the chip structure 120). The reliability and performance of the package structure are greatly improved.

Many variations and/or modifications can be made to embodiments of the disclosure. For example, the die package used for bonding to the circuit substrate 20 may be formed using different processes.

Figure 6A:
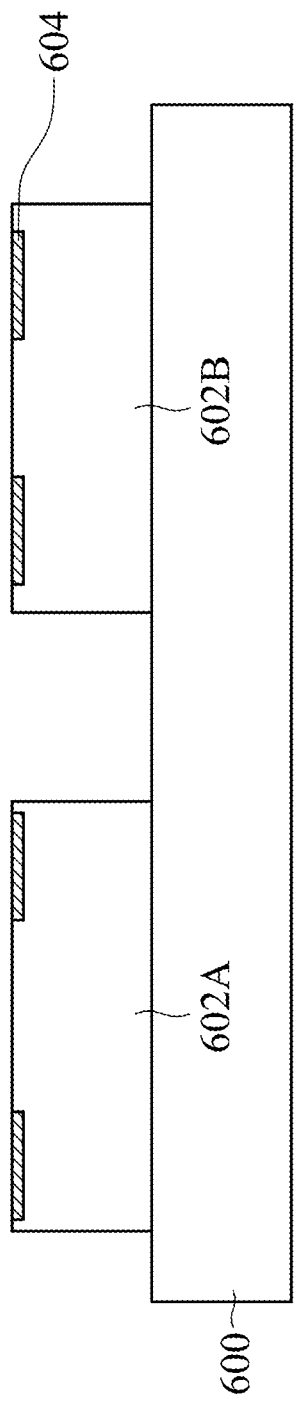
FIGS. 6A-6F are cross-sectional views of various stages of a process for forming a portion of a package structure, in accordance with some embodiments.

FIGS. 6A-6F are cross-sectional views of various stages of a process for forming a portion of a package structure, in accordance with some embodiments. As shown in FIG. 6A, a carrier substrate 600 is received or provided. The material of the carrier substrate 600 may be the same as or similar to that of the carrier substrate 100 illustrated in FIG. 1A.

As shown in FIG. 6A, chip structures (or chip-containing structures) 602A and 602B are disposed over the carrier substrate 600, in accordance with some embodiments. In some embodiments, the chip structures 602A and 602B are attached onto the carrier substrate 600 using an adhesive layer or an adhesive glue. Each of the chip structures 602A and 602B may be a single semiconductor die, system-on-integrated-chips (SoIC), and/or a package including one or more semiconductor dies that are encapsulated or protected. In some embodiments, the chip structures 602A and 602B are system-on-chip (SoC) chips that include multiple functions. In some embodiments, the front sides of the chip structures 602A and 602B face upwards with the back sides of the chip structures 602A and 602B facing the carrier substrate 600. As shown in FIG. 6A, each of the chip structures 602A and 602B includes conductive pads (or conductive pillars) 604 at the front sides.

Figure 6B:
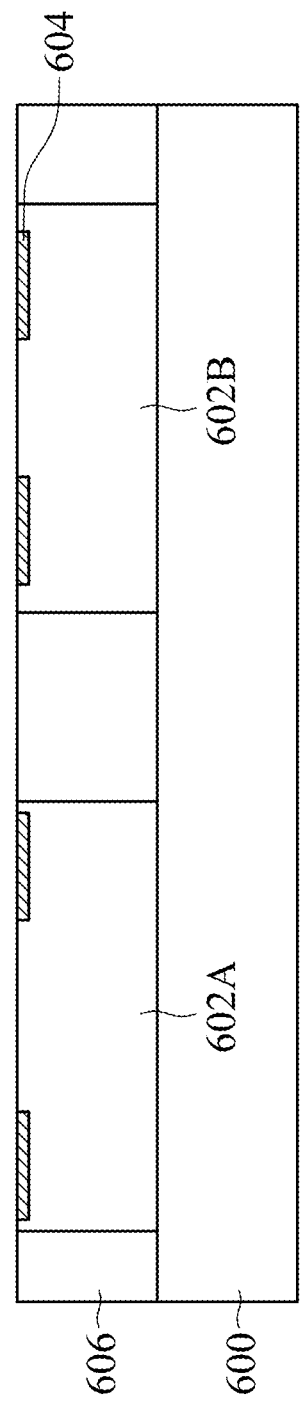

As shown in FIG. 6B, a protective layer 606 is formed over the carrier substrate 600 to surround the chip structures 602A and 602B, in accordance with some embodiments. The material and formation method of the protective layer 606 may be the same as or similar to those of the protective layer 116 illustrated in FIG. 1C. In some embodiments, the conductive pads 604 of the chip structures 602A and 602B are exposed without being covered by the protective layer 606.

Figure 6C:
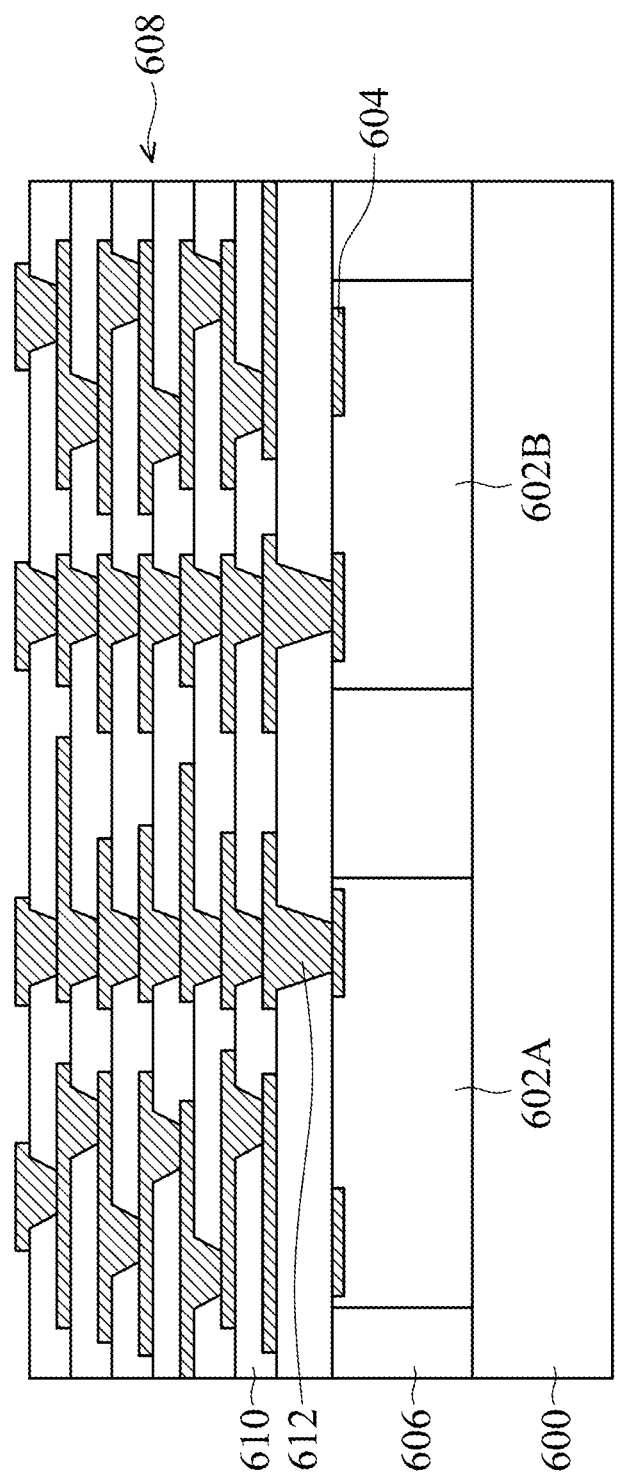

As shown in FIG. 6C, a redistribution structure 608 is formed over the protective layer 606 and the chip structures 602A and 602B, in accordance with some embodiments. Similar to the redistribution structure 102 in FIG. 1A, the redistribution structure 608 includes multiple insulating layers 610 and multiple conductive features 612. Each of the conductive pads 604 may be electrically connected to the respective conductive feature 612 in the redistribution structure 608. The material and formation method of the redistribution structure 608 may be the same as or similar to those of the redistribution structure 102 illustrated in FIG. 1A.

Figure 6D:
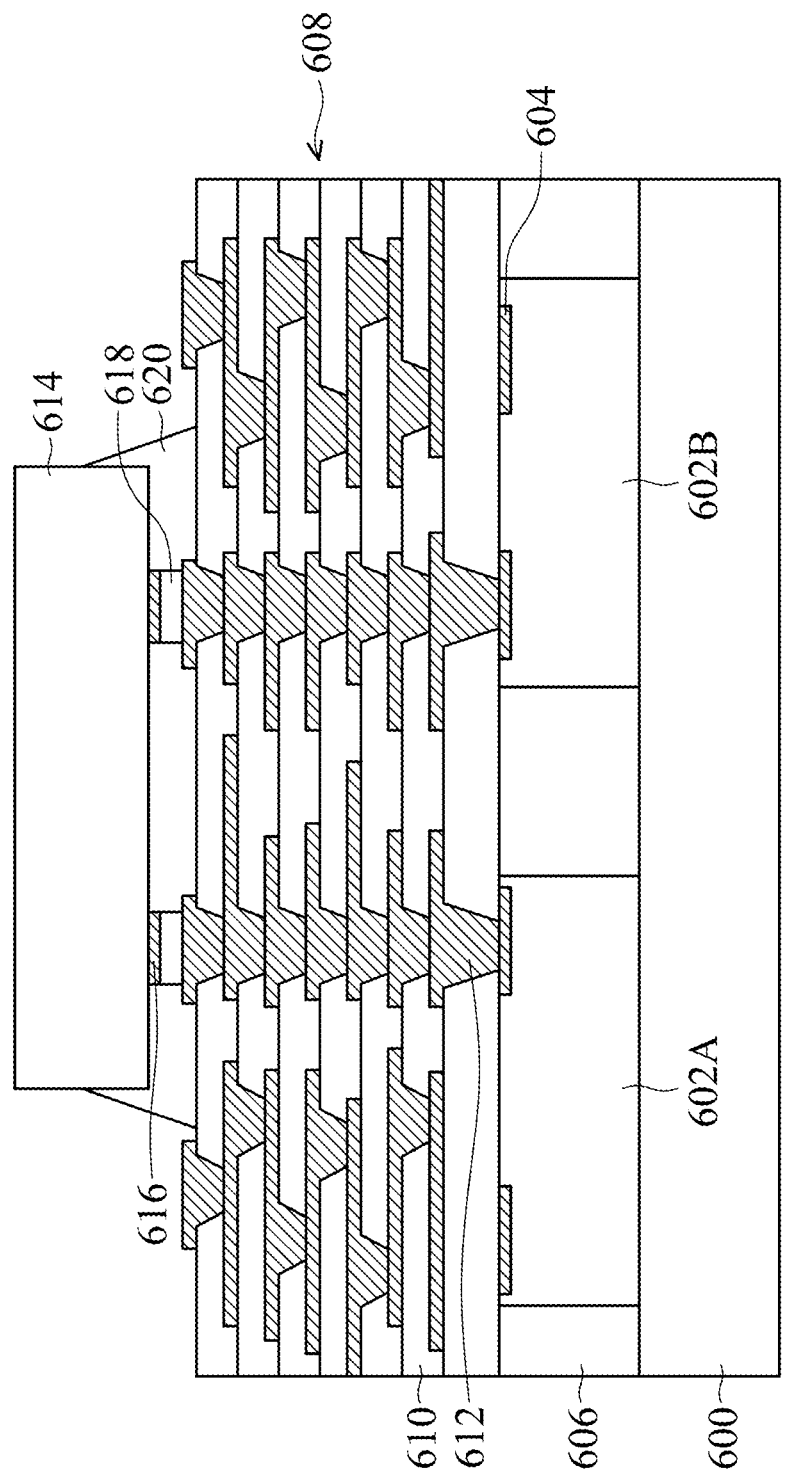

As shown in FIG. 6D, a chip structure (or a chip-containing structure) 614 is bonded onto the redistribution structure 608 through conductive connectors 618, in accordance with some embodiments. The material and formation method of the conductive connectors 618 may be the same as or similar to those of the conductive connectors 124 illustrated in FIG. 1E. Through the conductive connectors 618, electrical connections are formed between the conductive pillars (or conductive pads) 616 of the chip structure 614 and some of the conductive features 612 of the redistribution structure 608. In some embodiments, the chip structure 614 forms electrical connections between the chip structures 602A and 602B through some of the conductive features 612 of the redistribution structure 608, as shown in FIG. 6D.

The chip structure 614 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 614 is an interconnection die that receive and/or transfer electrical signals to and/or from the chip structures 602A and 602B. In some embodiments, the chip structure 614 has no active devices formed therein. In some other embodiments, the chip structure 614 includes active devices and passive devices formed therein. In some other embodiments, a surface mounted device is used to replace the chip structure 614. The surface mounted device may include, for example, resistors, capacitors, insulators, one or more other suitable devices, or a combination thereof.

As shown in FIG. 6D, an underfill material 620 is formed over the redistribution structure 608 to surround the conductive connectors 618, in accordance with some embodiments. The material and formation method of the underfill material 620 may be the same as or similar to those of the underfill material 126 illustrated in FIG. 1E. Many variations and/or modifications can be made to embodiments of the disclosure. In some other embodiments, the underfill material 620 is not formed.

Figure 6E:
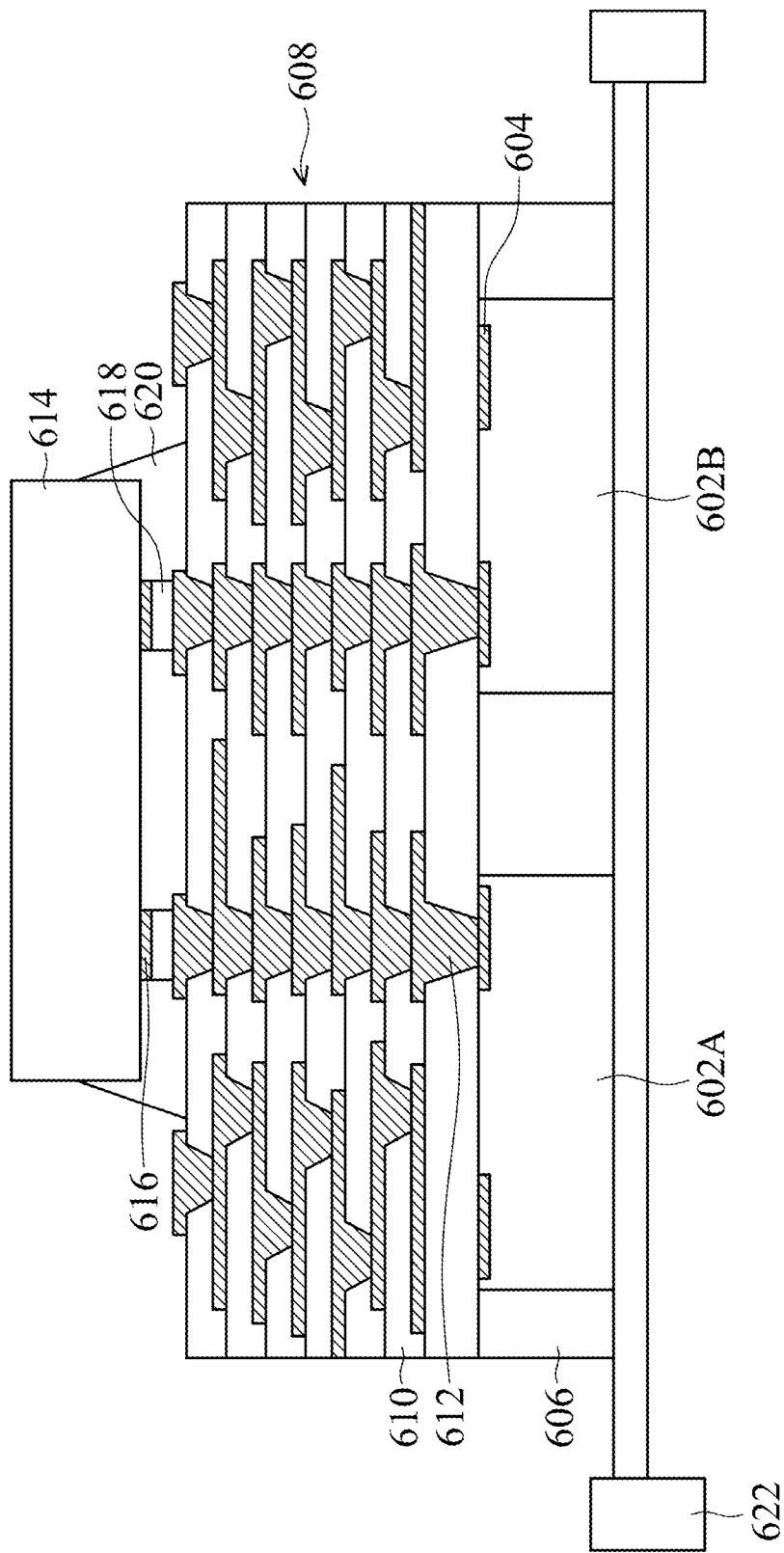
Figure 6F:
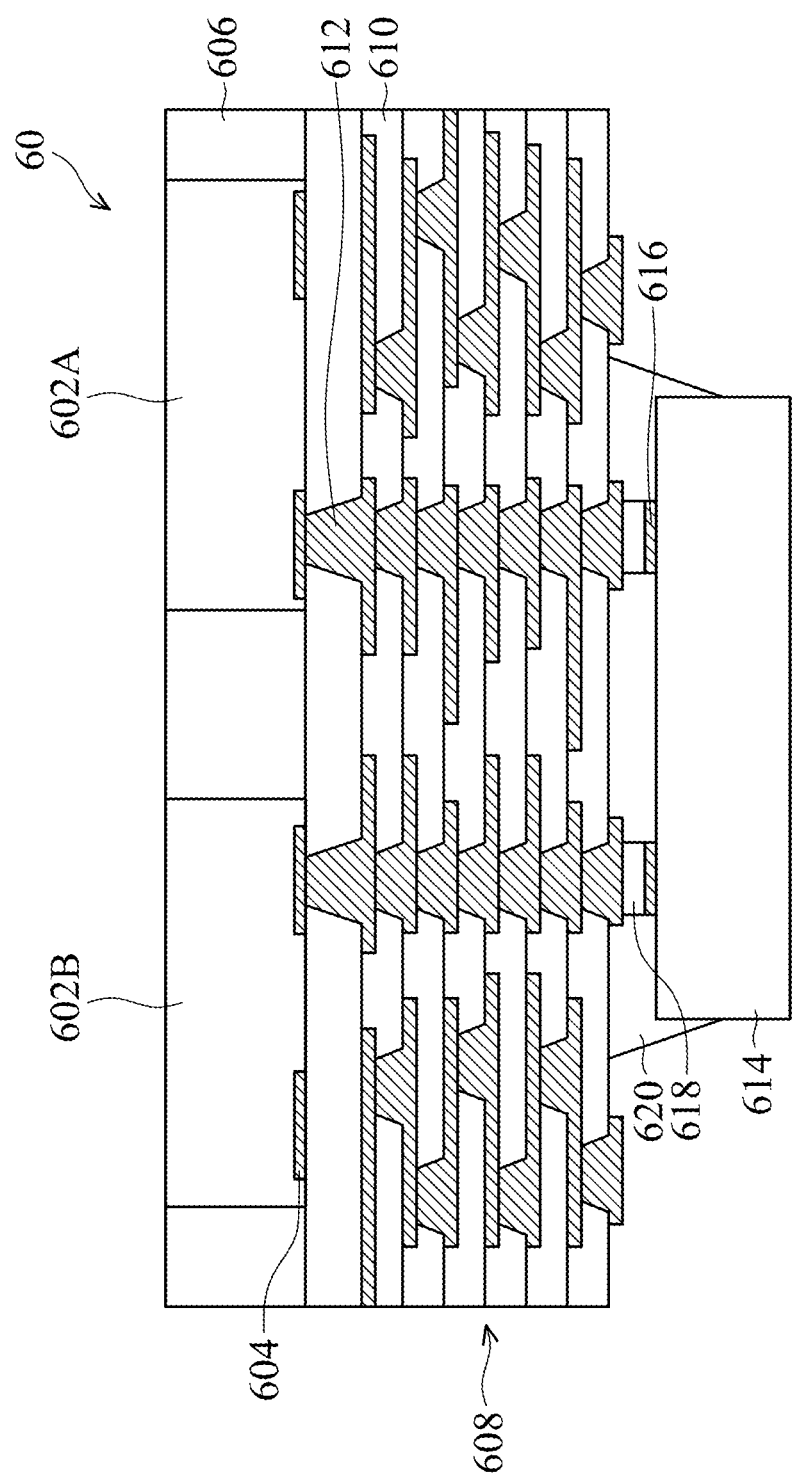

As shown in FIG. 6E, the carrier substrate 600 is removed, and then a carrier tape 622 is used to hold the package structure, in accordance with some embodiments. In some embodiments, a sawing process is then used to cut through the structure shown in FIG. 6E into multiple separate die packages. After the sawing process, one die package 60 is picked from the carrier tape 622 and turned upside down, as shown in FIG. 6F in accordance with some embodiments. The die package 60 is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 6E into multiple smaller die packages. The entirety of the wafer-level package structure may directly be integrated into a large package structure without being sawed.

Figure 7:
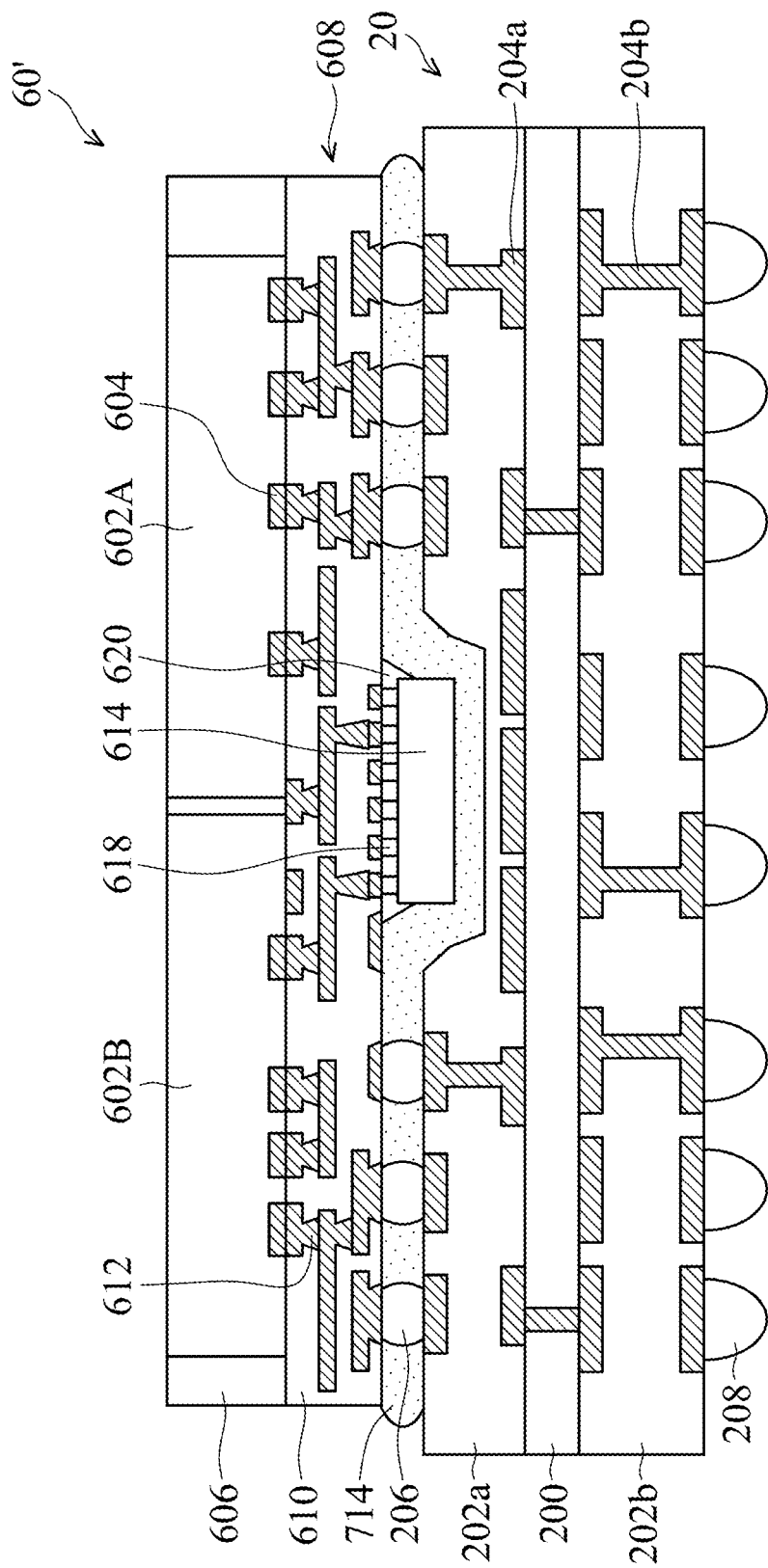
FIG. 7 is a cross-sectional view of a portion of a package structure, in accordance with some embodiments.

FIG. 7 is a cross-sectional view of a portion of a package structure, in accordance with some embodiments. Similar to the embodiments illustrated in FIG. 2C, a die package 60' that is the same as or similar to the die package 60 shown in FIG. 6F is received or provided. In some embodiments, the die package 60' is picked and placed over the circuit substrate 20, in accordance with some embodiments. Afterwards, the die package 60' is bonded to the circuit substrate 20 through the bonding structures 206.

Afterwards, an underfill material 714 is formed to surround the bonding structures 206 and the chip structure 614, as shown in FIG. 7 in accordance with some embodiments. The material and formation method of the underfill material 714 may be the same as or similar to those of the underfill material 214 illustrated in FIG. 2E. Due to the profile of the interior sidewalls of the circuit substrate 20, the void risk in the underfill material 714 is significantly reduced or prevented.

In some embodiments, the chip structures 602A and 602B are in direct contact with the redistribution structure 608, as shown in FIG. 7. The conductive pads 604 of the chip structures 602A and 602B are directly connected to some of the conductive features 612 of the redistribution structure 608 without other conductive connectors (such as solder bumps) formed therebetween. In some embodiments, the conductive features 612 of the redistribution structure 608 include multiple conductive vias. In some embodiments, each of the conductive vias has an upper end near the chip structure 602A or 602B and a lower end near the circuit substrate 20. In some embodiments, the lower end is wider than the upper end, as shown in FIG. 7.

In some embodiments, the redistribution structure 102 or 608 includes multiple polymer-containing insulating layers, as shown in FIG. 2E or 7. However, embodiments of the disclosure are not limited thereto. Many variations and/or modifications can be made to embodiments of the disclosure. In some embodiments, the redistribution structure that is bonded to the circuit substrate 20 includes multiple insulating layers that are not made of or not mainly made of polymer materials. In some embodiments, a semiconductor interposer substrate is used as a redistribution structure to replace the polymer-containing redistribution structure.

Figure 8C:
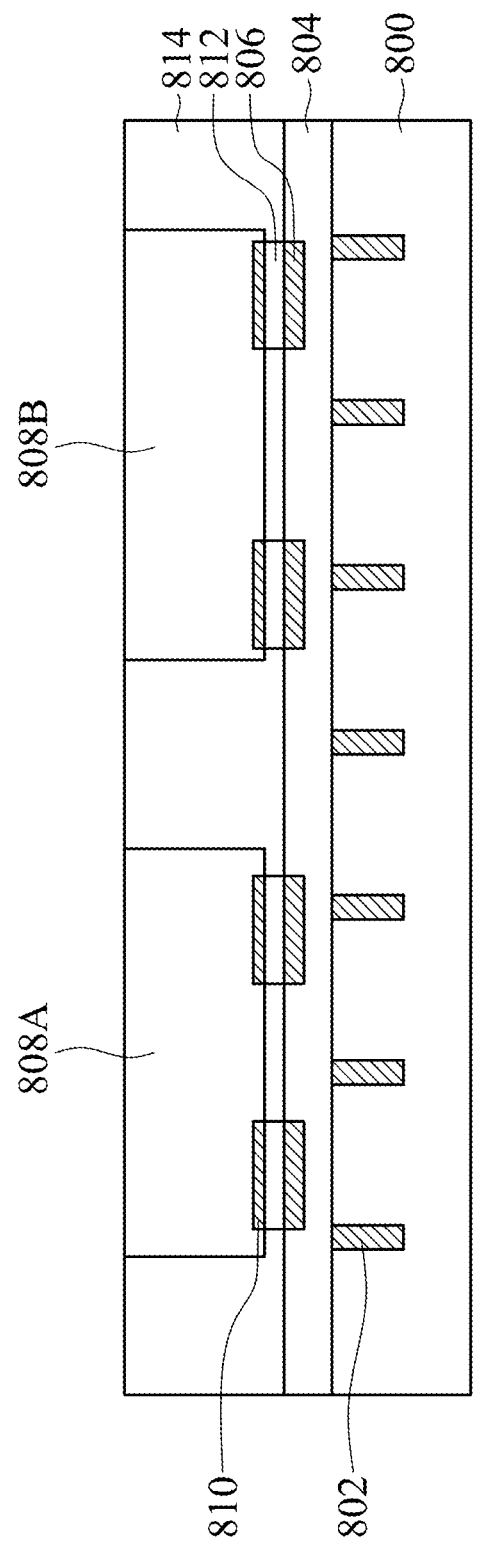

FIGS. 8A-8K are cross-sectional views of various stages of a process for forming a portion of a package structure, in accordance with some embodiments. In some embodiments, a semiconductor wafer (such as a silicon wafer) is received or provided. The semiconductor wafer includes a semiconductor substrate 800 and an interconnection structure 804 formed over the semiconductor substrate 800, as shown in FIG. 8A.

The semiconductor substrate 800 may be made of or include silicon, germanium, silicon germanium, gallium arsenide, one or more other suitable materials, or a combination thereof. The interconnection structure 804 may include multiple dielectric layers and multiple conductive features. The dielectric layers may be made of or include silicon oxide, silicon carbide, carbon-containing silicon oxide, silicon nitride, silicon oxynitride, one or more other suitable materials, or a combination thereof. The conductive features may include conductive lines, conductive vias, and conductive pads. The conductive features may be made of or include copper, aluminum, tungsten, cobalt, ruthenium, one or more other suitable materials, or a combination thereof. The formation of the interconnection structure 804 may involve multiple deposition processes, multiple patterning processes, and multiple planarization processes. As shown in FIG. 8A, conductive pads (or topmost metal layers) 806 of the interconnection structure 804 are shown.

In some embodiments, multiple conductive structures 802 are formed in the semiconductor substrate 800, as shown in FIG. 8A. The conductive structures 802 may function as conductive vias. In some embodiments, the semiconductor substrate 800 is partially removed to form multiple openings before the formation of the interconnection structure 804. The openings may be formed using one or more photolithography processes and one or more etching processes.

Afterwards, a dielectric layer (not shown in FIG. 8A) is deposited over the semiconductor substrate 800, in accordance with some embodiments. The dielectric layer extends along the sidewalls and bottoms of the openings. The dielectric layer may be used to electrically isolate the semiconductor substrate 800 and the conductive structures 802 that will be formed later. The dielectric layer may be made of or include silicon oxide, silicon oxynitride, silicon nitride, carbon-containing silicon oxide, carbon-containing silicon oxynitride, carbon-containing silicon nitride, silicon carbide, one or more other suitable materials, or a combination thereof. The dielectric layer may be deposited using a chemical vapor deposition (CVD) process, an atomic layer deposition (ALD) process, a thermal oxidation process, one or more other applicable processes, or a combination thereof.

A conductive material is then deposited over the semiconductor substrate 800 to partially or completely fill the openings of the semiconductor substrate 800, in accordance with some embodiments. The conductive material may be made of or include copper, aluminum, cobalt, tungsten, gold, titanium, platinum, one or more other suitable materials, or a combination thereof. The conductive material may be deposited using a physical vapor deposition (PVD) process, a CVD process, an ALD process, an electroplating process, an electroless plating process, one or more other applicable processes, or a combination thereof.

Afterwards, the conductive material is partially removed. As a result, the remaining portions of the conductive material form the conductive structures 802, as shown in FIG. 8A. A planarization process may be used to remove the portions of the conductive material outside of the openings. The remaining portions of the conductive material in the openings form the conductive structures 802. The planarization process may include a chemical mechanical polishing (CMP) process, a grinding process, an etching process, a dry polishing process, one or more other applicable processes, or a combination thereof.

Afterwards, the interconnection structure 804 is formed over the semiconductor substrate 800 and the conductive structures 802, in accordance with some embodiments. As mentioned above, the interconnection structure 804 includes multiple dielectric layers and multiple conductive features. Some of the conductive features may be used to form electrical connections to the conductive structures 802.

As shown in FIG. 8B, chip structures (or chip-containing structures) 808A and 808B are bonded onto the semiconductor wafer, in accordance with some embodiments. In some embodiments, the chip structures 808A and 808B are bonded onto the semiconductor wafer through conductive connectors 812 formed between the conductive pads 806 of the interconnection structure 804 and conductive pads 810 of the chip structures 808A and 808B. The conductive connectors 812 may include solder bumps. In some other embodiments, the chip structures 808A and 808B are bonded onto the semiconductor wafer through direct hybrid bonding that includes, for example, metal-to-metal bonding and dielectric-to-dielectric bonding. In these cases, the conductive connectors 812 are not formed.

Each of the chip structures 808A and 808B may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the interconnection structure 804. In some embodiments, some of the semiconductor dies include memory devices such as high bandwidth memory (HBM) devices.

As shown in FIG. 8C, a protective layer 814 is formed to surround the chip structures 808A and 808B, in accordance with some embodiments. The material and formation method of the protective layer 814 maybe the same as or similar to those of the protective layer 116 illustrated in FIG. 1C. In some embodiments, the top surface of the protective layer 814 is substantially level with the back sides of the chip structures 808A and 808B.

Figure 8D:
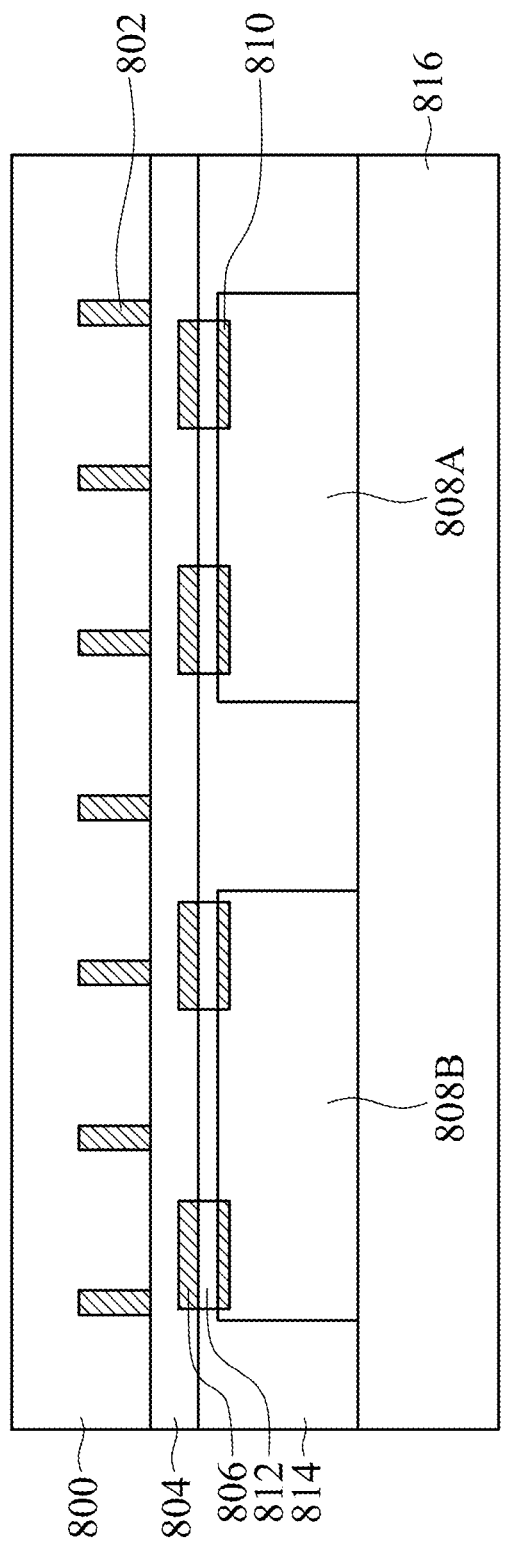

As shown in FIG. 8D, the structure shown in FIG. 8C is turned upside down and then attached to a temporary support substrate 816, in accordance with some embodiments. The temporary support substrate 816 may be made of a dielectric material, a semiconductor material, a metal material, one or more other suitable materials, or a combination thereof. For example, the temporary support substrate 816 is a silicon wafer or a glass wafer. In some embodiments, an adhesive tape or adhesive glue may be used to attach the temporary support substrate 816 to the protective layer 814.

Figure 8E:
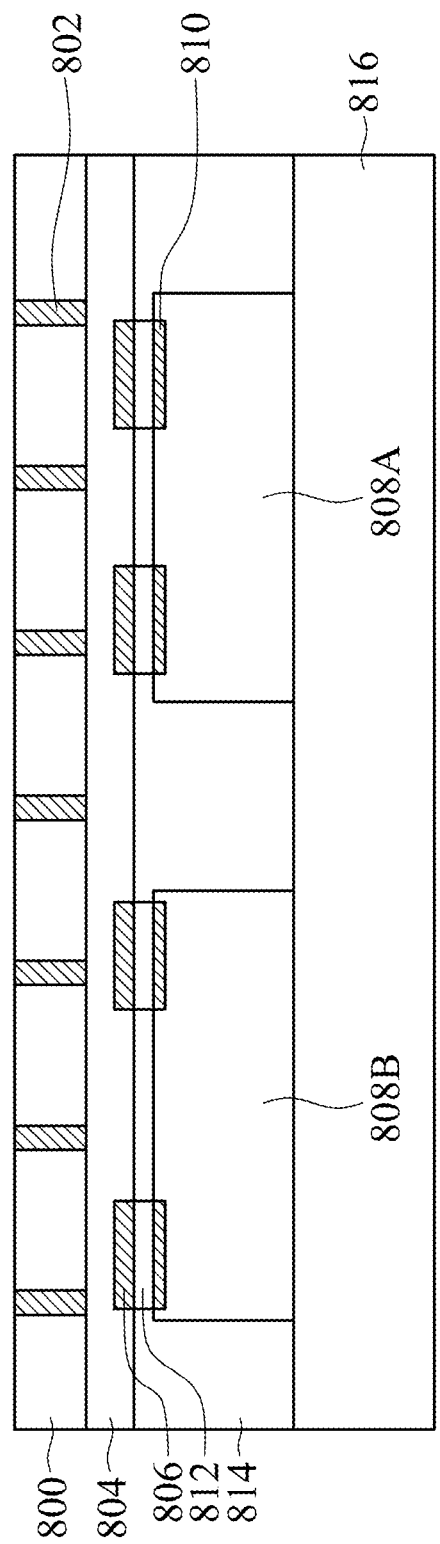

As shown in FIG. 8E, the semiconductor substrate 800 is partially removed to expose the conductive structures 802, in accordance with some embodiments. The conductive structures 802 may penetrate through the semiconductor substrate 800 after the semiconductor substrate 800 is partially removed. The conductive structures 802 may thus function as through substrate vias (TSVs). In some embodiments, a thinning process is used to partially remove the semiconductor substrate 800. The thinning process may include a CMP process, a grinding process, an etching process, a dry polishing process, one or more other applicable processes, or a combination thereof.

Figure 8F:
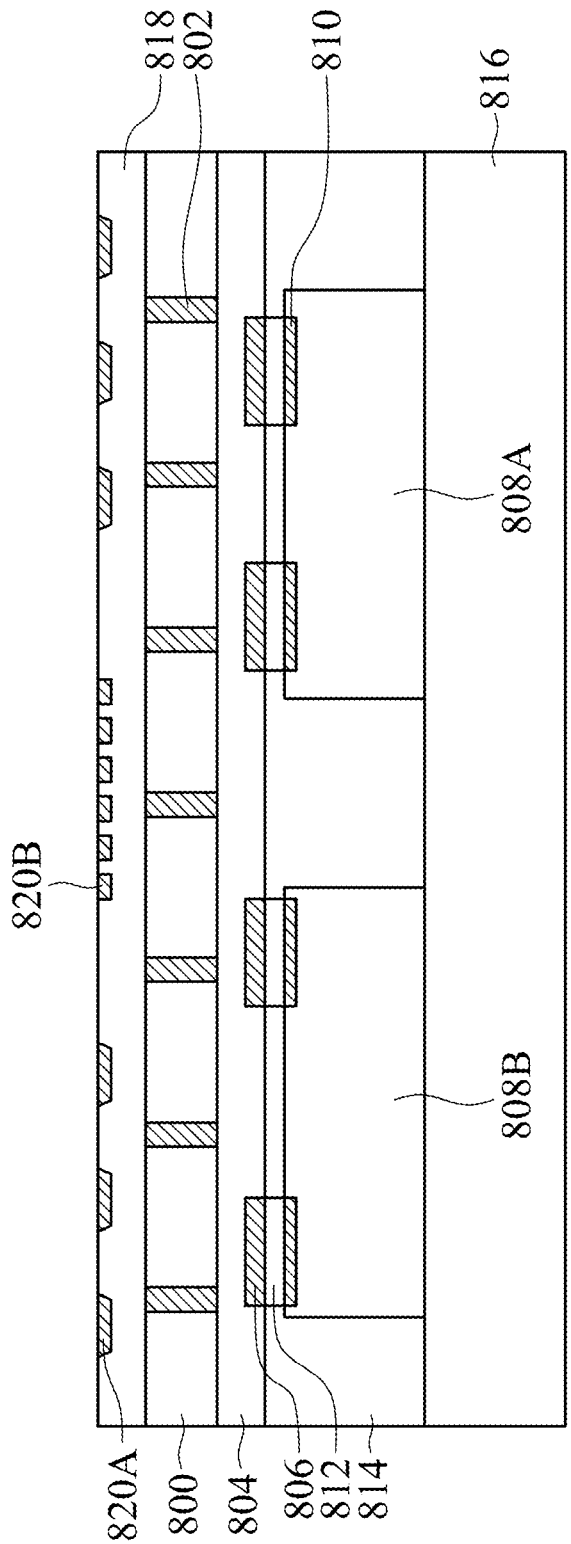

As shown in FIG. 8F, an interconnection structure 818 is formed over the semiconductor substrate 800 and the conductive structures 802, in accordance with some embodiments. Similar to the interconnection structure 804, the interconnection structure 818 includes multiple dielectric layers and multiple conductive features. The conductive features of the interconnection structure 818 include conductive lines, conductive vias, and conductive pads 820A and 820B. In some embodiments, each of the conductive structures 802 is electrically connected to the respective conductive pad 820A or 820B and the respective conductive pad 806.

Many variations and/or modifications can be made to embodiments of the disclosure. In some other embodiments, similar to the redistribution structure 102 shown in FIG. 1A, the interconnection structure 818 includes multiple polymer-containing insulating layers and multiple conductive features.

Figure 8G:
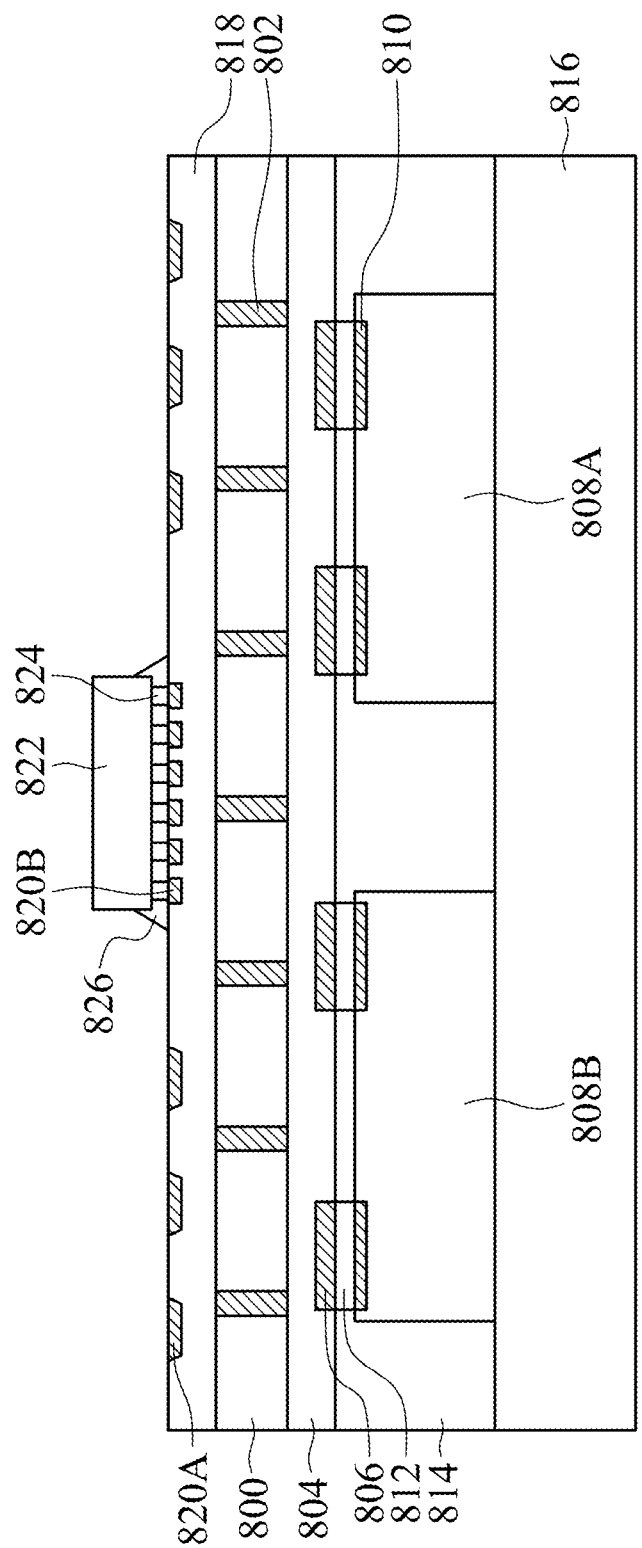

As shown in FIG. 8G, a chip structure (or chip-containing structure) 822 is bonded onto the interconnection structure 818, in accordance with some embodiments. In some embodiments, the chip structure 822 is bonded onto the conductive pads 820B of the interconnection structure 818 through conductive connectors 824, in accordance with some embodiments. The material and formation method of the conductive connectors 824 may be the same as or similar to those of the conductive connectors 124 illustrated in FIG. 1E.

Many variations and/or modifications can be made to embodiments of the disclosure. In some other embodiments, the chip structure 822 is bonded onto the interconnection structure 818 through direct hybrid bonding that includes metal-to-metal bonding and dielectric-to-dielectric bonding. In these cases, the conductive connectors 824 are not formed.

The chip structure 822 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 822 is an interconnection die that receive and/or transfer electrical signals to and/or from the chip structures 808A and 808B. In some embodiments, the chip structure 822 has no active devices formed therein. In some other embodiments, the chip structure 822 includes active devices and passive devices formed therein. In some other embodiments, a surface mounted device is used to replace the chip structure 822. The surface mounted device may include, for example, resistors, capacitors, insulators, one or more other suitable devices, or a combination thereof.

As shown in FIG. 8G, an underfill material 826 is formed over the interconnection structure 818 to surround the conductive connectors 824, in accordance with some embodiments. The material and formation method of the underfill material 826 may be the same as or similar to those of the underfill material 126 illustrated in FIG. 1E. Many variations and/or modifications can be made to embodiments of the disclosure. In some other embodiments, the underfill material 826 is not formed.

However, embodiments of the disclosure are not limited thereto. In some embodiments, the chip structure 822 is bonded onto the interconnection structure 818 through direct hybrid bonding. In some embodiments, the underfill material 826 is not formed since no additional conductive connectors are formed between the chip structure 822 and the interconnection structure 818.

Figure 8H:
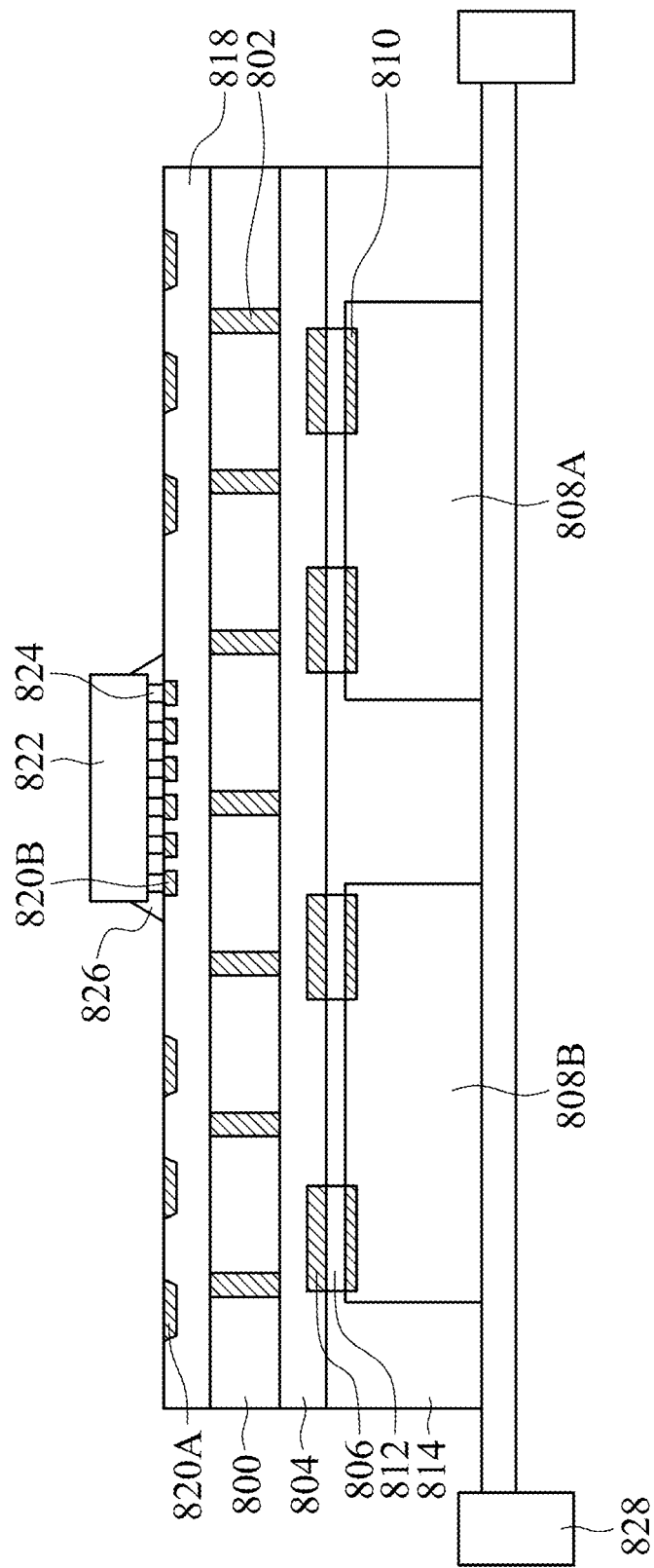

As shown in FIG. 8H, the temporary support substrate 816 is removed, and then a carrier tape 828 is used to hold the package structure, in accordance with some embodiments. In some embodiments, a sawing process is then used to cut through the structure shown in FIG. 8H into multiple separate die packages.

However, embodiments of the disclosure are not limited thereto. Many variations and/or modifications can be made to embodiments of the disclosure. In some other embodiments, the sawing process is not performed to separate the structure in FIG. 8H into multiple smaller die packages. The entirety of the wafer-level package structure may directly be integrated into a large package structure without being sawed.

Figure 8I:
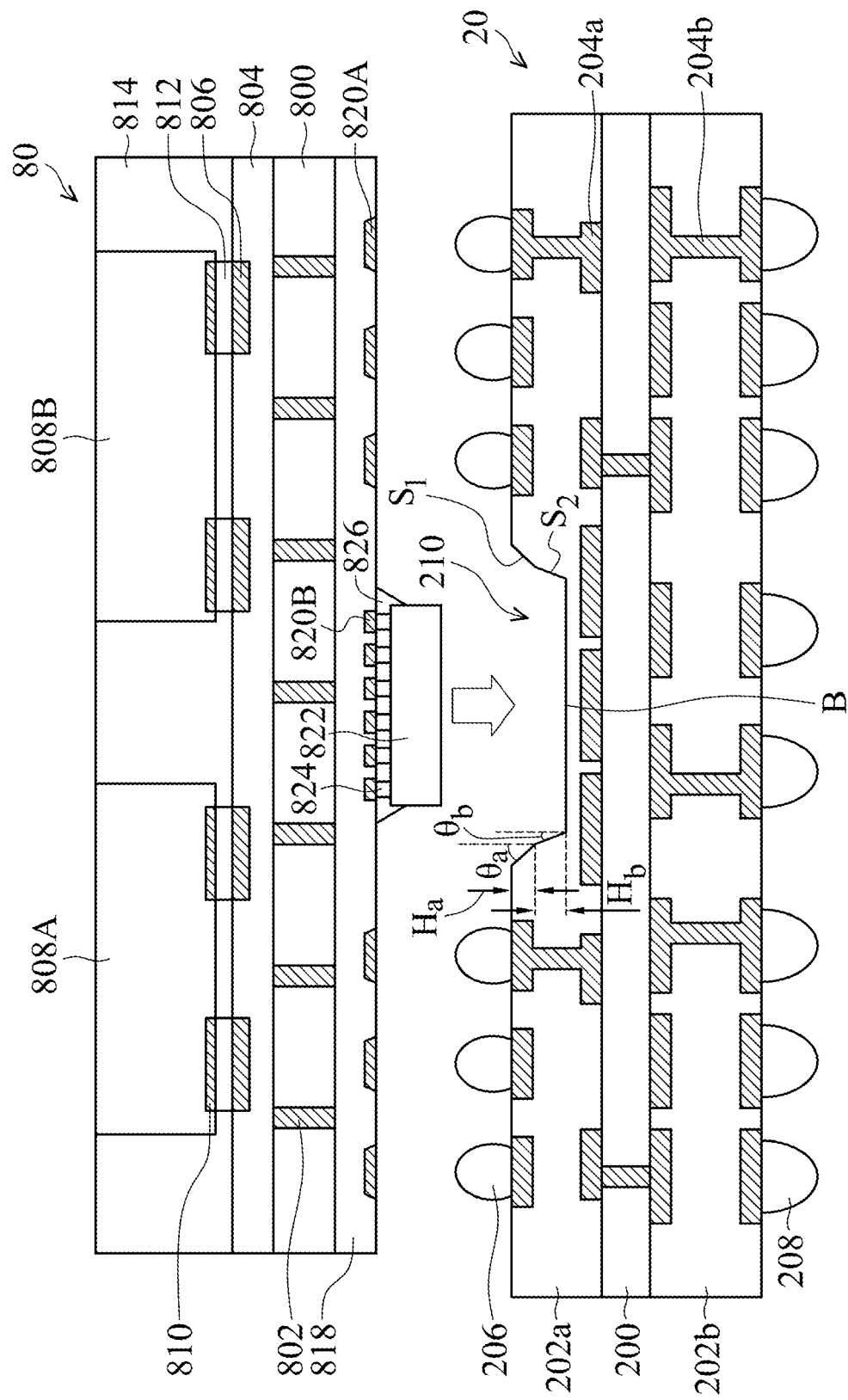

After the sawing process, one die package 80 is picked from the carrier tape 828 and turned upside down, as shown in FIG. 8I in accordance with some embodiments. The die package 80 is to be integrated with other elements (such as the circuit substrate 20) to form a larger package structure, as shown in FIG. 8I.

Figure 8J:
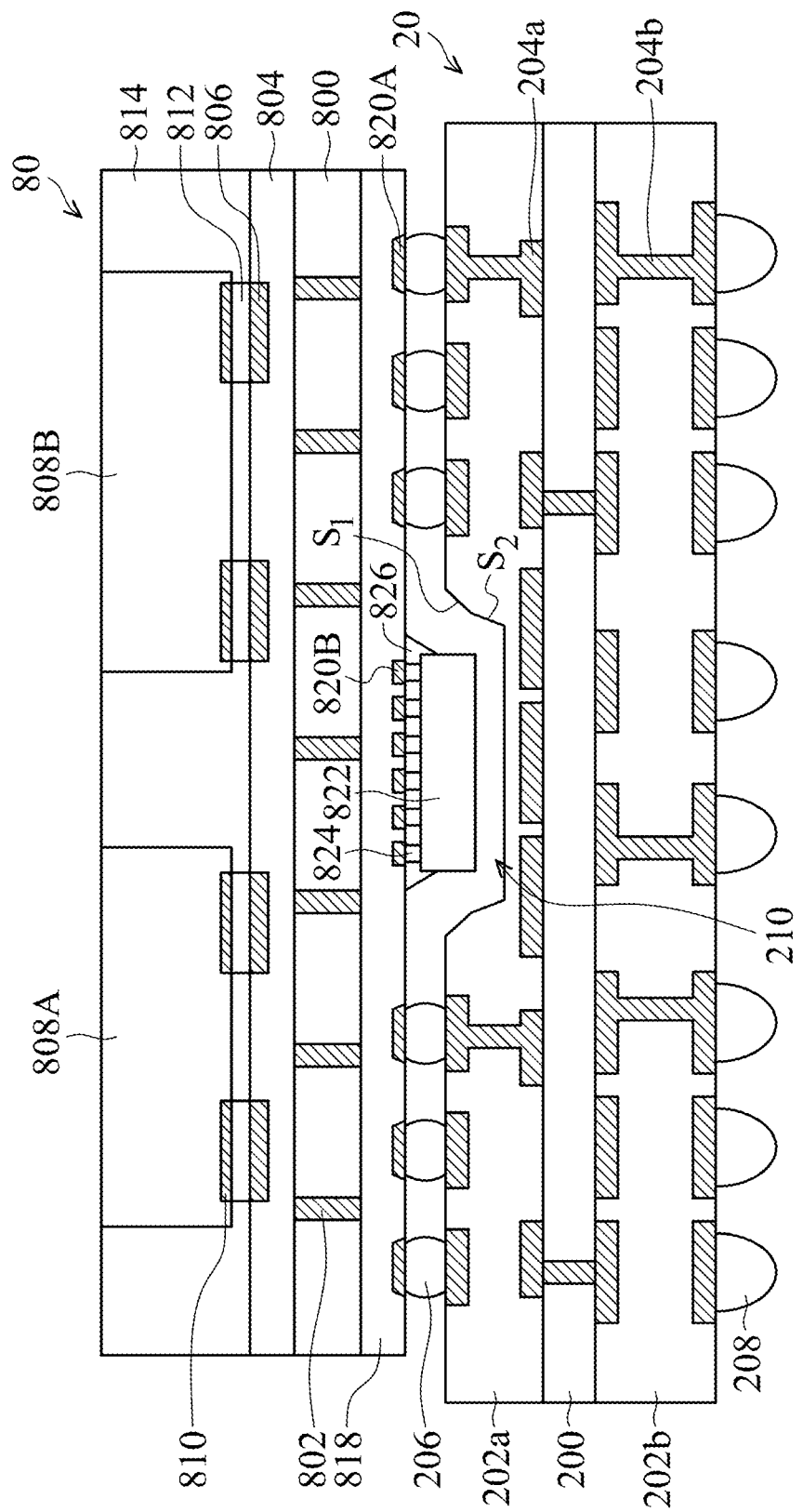

As shown in FIG. 8J, similar to the embodiments illustrated in FIG. 2C, the die package 80 is placed over the circuit substrate 20, in accordance with some embodiments. Afterwards, the die package 80 is bonded to the circuit substrate 20 through the bonding structures 206.

Figure 8K:
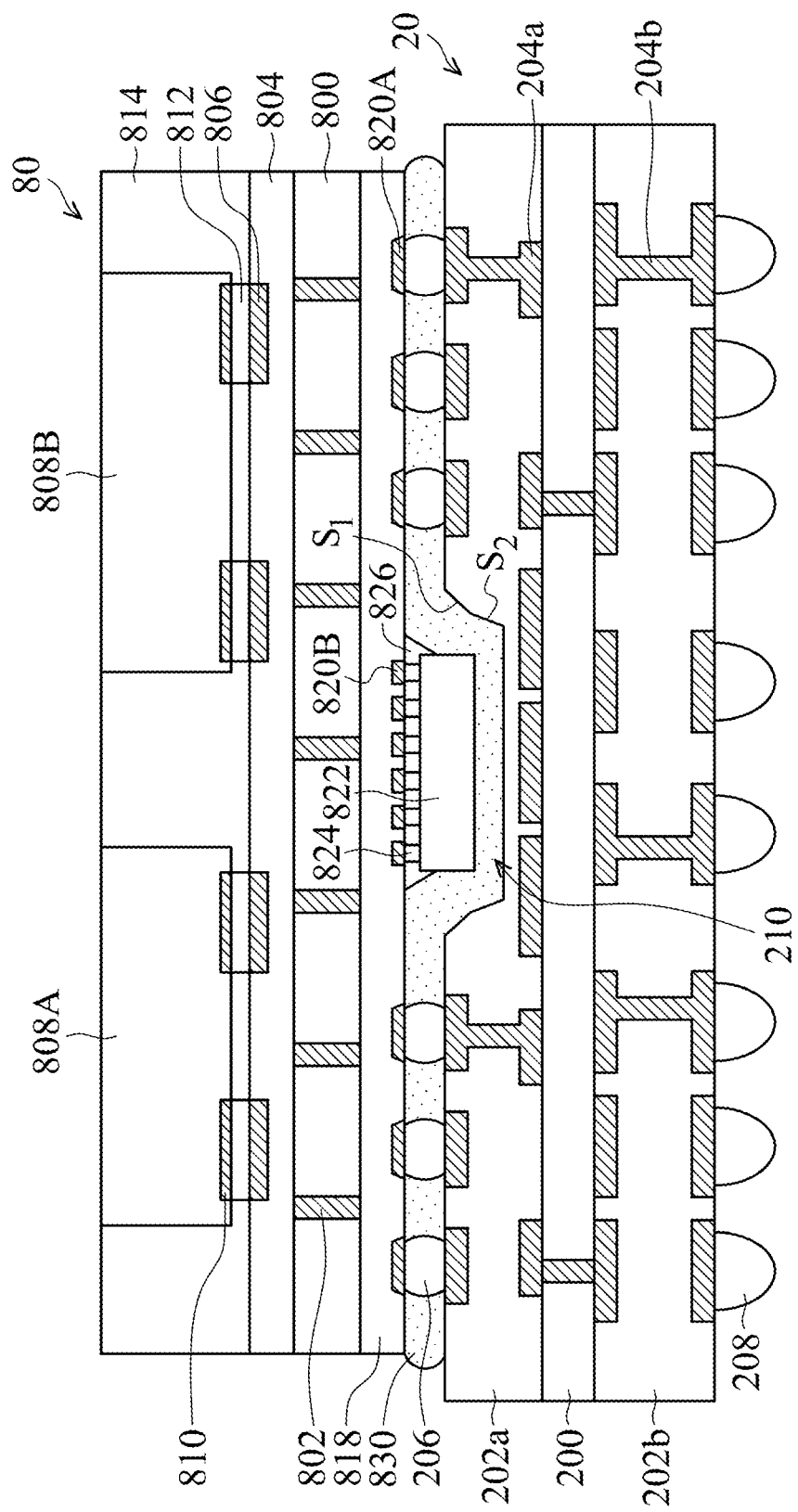

As shown in FIG. 8K, an underfill material 830 is formed to surround the bonding structures 206 and the chip structure 822, in accordance with some embodiments. The material and formation method of the underfill material 830 may be the same as or similar to those of the underfill material 214 illustrated in FIG. 2E.

Embodiments of the disclosure bond a die package to a circuit substrate with a recess. One or more component of the die package enters the recess after the die package and the circuit substrate are bonded together. As a result, the total height of the package structure is further reduced. The components of the die package that enter the recess may include a semiconductor die, a chip structure containing one or more semiconductor die, and/or a surface mounted device. An underfill material is formed into the space between the die package and the circuit substrate to fill the recess and to protect the one or more components. The recess is designed to have an upper sidewall and a lower sidewall that have different slopes. The special profile of the recess facilitates the formation of the underfill material. The dispensing and filling of the underfill material become easier. The potential void risk in the underfill material is significantly reduced or prevented. The reliability and performance of the package structure are greatly improved.

In accordance with some embodiments, a method for forming a package structure is provided. The method includes forming a recess in a circuit substrate, and the recess has a first sidewall and a second sidewall. The second sidewall is between the first sidewall and a bottommost surface of the circuit substrate, and the second sidewall is steeper than the first sidewall. The method also includes forming a die package, and the die package has a semiconductor die. The method further includes bonding the die package to the circuit substrate through bonding structures such that a portion of the semiconductor die enters the recess of the circuit substrate. In addition, the method includes forming an underfill material to surround the bonding structures and to fill the recess.

In accordance with some embodiments, a method for forming a package structure is provided. The method includes partially removing a circuit substrate to form a recess. The recess has an upper sidewall connecting to a top surface of the circuit substrate and a lower sidewall connecting to a bottom edge of the upper sidewall, and the upper sidewall and the lower sidewall have different slopes. The method also includes forming a die package and bonding the die package to the circuit substrate through bonding structures such that a component of the die package enters the recess. The method further includes forming an underfill material to fill the recess.

In accordance with some embodiments, a package structure is provided. The package structure includes a circuit substrate having interior sidewalls to form a recess. The interior sidewalls have an upper sidewall and a lower sidewall, and the lower sidewall is steeper than the upper sidewall. The package structure also includes a die package bonded to the circuit substrate through bonding structures. A component of the die package is partially surrounded by the interior sidewalls. The package structure further includes an underfill material surrounding the bonding structures and the component of the die package and extending to the interior sidewalls of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a recess in a circuit substrate, wherein the recess has a first sidewall and a second sidewall, the second sidewall is between the first sidewall and a bottommost surface of the circuit substrate, the second sidewall is steeper than the first sidewall, the recess is formed to have a third sidewall between the first sidewall and the second sidewall, the third sidewall is steeper than the first sidewall, and the second sidewall is steeper than the third sidewall;
    forming a die package, wherein the die package has a semiconductor die;
    bonding the die package to the circuit substrate through bonding structures such that a portion of the semiconductor die enters the recess of the circuit substrate; and
    forming an underfill material to surround the bonding structures and to fill the recess.

2. The method for forming a package structure as claimed in claim 1, wherein the recess is formed using an energy beam drilling process.

3. The method for forming a package structure as claimed in claim 1, wherein the recess is formed using a mechanical drilling process.

4. The method for forming a package structure as claimed in claim 1, wherein the formation of the die package comprises:
    forming a redistribution structure over a carrier substrate;
    disposing at least one second semiconductor die over the carrier substrate;
    forming a protective layer over the redistribution structure to surround the at least one second semiconductor die;
    removing the carrier substrate; and
    disposing the semiconductor die over the redistribution structure after the carrier substrate is removed, wherein the semiconductor die and the at least one second semiconductor die are disposed over opposite surfaces of the redistribution structure.

5. The method for forming a package structure as claimed in claim 4, wherein the redistribution structure comprises a plurality of polymer-containing layers and a plurality of conductive features.

6. The method for forming a package structure as claimed in claim 1, wherein the formation of the die package comprises:
    disposing at least one second semiconductor die over a carrier substrate;
    forming a protective layer over the carrier substrate to surround the at least one second semiconductor die;
    forming a redistribution structure over the protective layer and the at least one second semiconductor die; and
    disposing the semiconductor die over the redistribution structure, wherein the semiconductor die and the at least one second semiconductor die are disposed over opposite surfaces of the redistribution structure.

7. The method for forming a package structure as claimed in claim 6, further comprising removing the carrier substrate after the semiconductor die is disposed.

8. The method for forming a package structure as claimed in claim 6, wherein the redistribution structure comprises a plurality of polymer-containing layers and a plurality of conductive features.

9. The method for forming a package structure as claimed in claim 1, wherein the formation of the die package comprises:
    forming a plurality of conductive vias in a semiconductor substrate;

disposing at least one second semiconductor die over a front surface of the semiconductor substrate;

forming a protective layer over the semiconductor substrate to surround the at least one second semiconductor die;

thinning the semiconductor substrate from a back surface of the semiconductor substrate to expose the conductive vias;

forming a redistribution structure over the semiconductor substrate, wherein the semiconductor substrate is between the redistribution structure and the at least one second semiconductor die; and disposing the semiconductor die over the redistribution structure, wherein the semiconductor substrate is between the semiconductor die and the at least one second semiconductor die.

10. A method for forming a package structure, comprising:

receiving a circuit substrate, wherein the circuit substrate has a recess, the recess has an upper sidewall connecting to a top surface of the circuit substrate and a lower sidewall connecting to a bottom edge of the upper sidewall, and the upper sidewall and the lower sidewall have different slopes;

forming a die package, wherein the formation of the die package comprises:

forming a redistribution structure over a carrier substrate, wherein the redistribution structure comprises a plurality of polymer-containing layers and a plurality of conductive features; and removing the carrier substrate;

bonding the die package to the circuit substrate through bonding structures such that a component of the die package enters the recess, wherein the component is bonded to the redistribution structure; and forming an underfill material to fill the recess.

11. The method for forming a package structure as claimed in claim 10, wherein the lower sidewall is steeper than the upper sidewall.

12. The method for forming a package structure as claimed in claim 10, further comprising:

disposing at least one semiconductor die over the carrier substrate before the redistribution structure is formed; and forming a protective layer surrounding the at least one semiconductor die before the redistribution structure is formed.

13. The method for forming a package structure as claimed in claim 10, further comprising:

disposing at least one semiconductor die over the redistribution structure;

forming a protective layer over the redistribution structure to surround the at least one semiconductor die; and disposing the component over the redistribution structure after the carrier substrate is removed, wherein the component and the at least one semiconductor die are disposed over opposite surfaces of the redistribution structure.

14. A package structure, comprising:

a circuit substrate having interior sidewalls to form a recess, wherein the interior sidewalls have an upper sidewall and a lower sidewall, the lower sidewall is steeper than the upper sidewall, the interior sidewalls have an intermediate sidewall, the intermediate sidewall is between the upper sidewall and the lower sidewall, the intermediate sidewall is steeper than the upper sidewall, and the lower sidewall is steeper than the intermediate sidewall;

a die package bonded to the circuit substrate through bonding structures, wherein a component of the die package is partially surrounded by the interior sidewalls; and an underfill material surrounding the bonding structures and the component of the die package and extending to the interior sidewalls of the recess.

15. The package structure as claimed in claim 14, wherein the underfill material is in direct contact with the interior sidewalls of the circuit substrate.

16. The package structure as claimed in claim 14, wherein the component of the die package has a first width measured along a first direction, the recess has a second width measured along a second direction parallel to the first direction, and a ratio of the first width to the second width is in a range from about 0.1 to about 0.75.

17. The package structure as claimed in claim 16, wherein the component of the die package has a third width measured along a third direction, the recess has a fourth width measured along a fourth direction parallel to the third direction, the third direction is substantially perpendicular to the first direction, and a ratio of the third width to the fourth width is in a range from about 0.1 to about 0.75.

18. The package structure as claimed in claim 14, wherein the upper sidewall has a first height, the lower sidewall has a second height, and the first height is substantially equal to the second height.

19. The package structure as claimed in claim 14, wherein the upper sidewall has a first height, the lower sidewall has a second height, and a ratio of the first height to a sum of the first height and the second height is in a range from about 0.1 to about 0.9.

20. The package structure as claimed in claim 14, wherein the upper sidewall is at a first angle to the vertical, the lower sidewall is at a second angle to the vertical, the first angle is in a range from about 30 degrees to about 60 degrees, and a ratio of the first angle to the second angle is in a range from about 2 to about 4.

* * * * *